United States Patent
Lee et al.

(10) Patent No.: US 12,464,890 B2
(45) Date of Patent: Nov. 4, 2025

(54) DISPLAY PANEL AND ELECTRONIC DEVICE INCLUDING THE SAME

(71) Applicant: Samsung Display Co., Ltd., Yongin-si (KR)

(72) Inventors: Hyemin Lee, Gimpo-si (KR); Heechang Yoon, Anyang-si (KR); Hyoung Sub Lee, Yongin-si (KR); Jinho Hyun, Gwacheon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 469 days.

(21) Appl. No.: 17/950,396

(22) Filed: Sep. 22, 2022

(65) Prior Publication Data
US 2023/0180514 A1     Jun. 8, 2023

(30) Foreign Application Priority Data
Dec. 6, 2021 (KR) .................. 10-2021-0172924

(51) Int. Cl.
*H10K 50/844* (2023.01)
*G06F 3/044* (2006.01)
*H10K 50/84* (2023.01)
*H10K 59/40* (2023.01)

(52) U.S. Cl.
CPC ......... *H10K 50/844* (2023.02); *G06F 3/0446* (2019.05); *H10K 50/846* (2023.02); *H10K 59/40* (2023.02)

(58) Field of Classification Search
CPC ... H10K 59/8731; H10K 59/873; H10K 59/40
See application file for complete search history.

(56) References Cited

U.S. PATENT DOCUMENTS

| 8,492,974 B2 | 7/2013 | Lee et al. |
| 10,840,477 B2 | 11/2020 | Zhao et al. |
| 10,991,909 B2 | 4/2021 | Kim et al. |
| 2008/0061288 A1* | 3/2008 | Tomono ............... H10K 71/611 257/E51.001 |

(Continued)

FOREIGN PATENT DOCUMENTS

| CN | 109103234 A | * 12/2018 | ............ H01L 27/32 |
| CN | 110867522 A | * 3/2020 | ............... G09F 9/33 |

(Continued)

OTHER PUBLICATIONS

Extended European Search Report for Application No. 22210966.2-1211 dated Apr. 21, 2023.

*Primary Examiner* — Evren Seven
(74) *Attorney, Agent, or Firm* — CANTOR COLBURN LLP

(57) ABSTRACT

A display panel includes a base layer including a display area and a non-display area adjacent to the display area, a plurality of light-emitting elements disposed in the display area, a hydrophobic layer disposed in the non-display area and spaced apart from the light-emitting elements, an insulating layer disposed on the light-emitting elements and including an upper surface and an inclined surface inclined with respect to the upper surface, and a plurality of patterns contacting with the hydrophobic layer, and the plurality of patterns is spaced apart from the inclined surface.

19 Claims, 11 Drawing Sheets

(56) References Cited

U.S. PATENT DOCUMENTS

| | | | | |
|---|---|---|---|---|
| 2014/0141191 A1* | 5/2014 | Lee | ................ | H01G 9/2077 |
| | | | | 427/407.1 |
| 2016/0307971 A1* | 10/2016 | Jeon | ................ | H10K 59/00 |
| 2019/0332210 A1* | 10/2019 | Lee | ................ | G01L 1/22 |
| 2020/0067016 A1 | 2/2020 | Park et al. | | |
| 2020/0159350 A1* | 5/2020 | Yang | ................ | G06F 3/044 |
| 2020/0293134 A1* | 9/2020 | Shim | ................ | G06F 3/0445 |
| 2021/0126057 A1* | 4/2021 | Seo | ................ | H10K 50/844 |
| 2021/0134893 A1* | 5/2021 | Lee | ................ | H10K 50/818 |
| 2021/0328184 A1* | 10/2021 | Jung | ................ | H10K 59/8722 |
| 2021/0347957 A1* | 11/2021 | Wang | ................ | C09J 133/064 |
| 2021/0359258 A1* | 11/2021 | Guo | ................ | H10K 50/8426 |
| 2023/0165054 A1 | 5/2023 | Lee et al. | | |
| 2023/0345800 A1* | 10/2023 | Hyun | ................ | H10K 59/88 |
| 2024/0224726 A1* | 7/2024 | Park | ................ | H10K 50/844 |
| 2024/0260406 A1* | 8/2024 | Han | ................ | H10K 59/1201 |

FOREIGN PATENT DOCUMENTS

| | | | |
|---|---|---|---|
| KR | 20160140080 A | | 12/2016 |
| KR | 1020190081724 A | | 7/2019 |
| KR | 20190090110 A | | 8/2019 |
| KR | 102124024 B1 | * | 6/2020 |
| KR | 20210115113 A | | 9/2021 |
| WO | 2021182679 A1 | | 9/2021 |

* cited by examiner

DISPLAY PANEL AND ELECTRONIC DEVICE INCLUDING THE SAME

This application claims priority to Korean Patent Application No. 10-2021-0172924, filed on Dec. 6, 2021, and all the benefits accruing therefrom under 35 U.S.C. § 119, the content of which in its entirety is herein incorporated by reference.

BACKGROUND

1. Field

Embodiments of the invention relate to a display panel and an electronic device including the same. More particularly, embodiments of the invention relate to an electronic device capable of displaying an image and sensing an external input.

2. Description of the Related Art

Multimedia devices, such as televisions, mobile phones, tablet computers, navigation devices, and game devices, include a display panel displaying an image and an input sensor sensing an external input. The display panel includes pixels generating the image and an encapsulation layer covering the pixels, and the input sensor is disposed on the encapsulation layer.

The encapsulation layer includes an organic layer formed by curing a liquid organic material. Demands for a development of a structure controlling a flow of the organic material are increasing such that the organic material having fluidity is formed in a desired area in the display panel to reduce a dead space of the display panel.

SUMMARY

Embodiments of the invention provide a display panel with a reduce dead space obtained by controlling a deposition position and an inclination angle of an organic layer forming an encapsulation layer.

Embodiments of the invention provide a display panel in which the deposition position of the organic layer of the encapsulation layer is monitored.

Embodiments of the invention provide an electronic device including the display panel.

An embodiment of the invention provides a display panel including a base layer including a display area and a non-display area adjacent to the display area, a plurality of light-emitting elements disposed in the display area, a hydrophobic layer disposed in the non-display area and spaced apart from the light-emitting elements, an insulating layer disposed on the light-emitting elements and including an upper surface and an inclined surface inclined with respect to the upper surface, and a plurality of patterns that contacts the hydrophobic layer. The plurality of patterns is spaced apart from the inclined surface.

In an embodiment, the hydrophobic layer may be include a fluoride compound.

In an embodiment, the hydrophobic layer may surround the insulating layer in a plan view.

In an embodiment, an end of the hydrophobic layer may contact the inclined surface of the insulating layer.

In an embodiment, an angle between the inclined surface of the insulating layer and an upper surface of the hydrophobic layer may be equal to or smaller than about 90 degrees.

In an embodiment, the one end of the hydrophobic layer may be disposed at a position higher than a position at which lower surfaces of the plurality of patterns that contact the hydrophobic layer are disposed in a cross-section.

In an embodiment, the plurality of patterns and the insulating layer may include an organic material.

In an embodiment, the plurality of patterns may include the same material as that of the insulating layer.

In an embodiment, each of the plurality of patterns may include a lower surface that contacts the hydrophobic layer and a curved surface protruded from the lower surface in a cross-section.

In an embodiment, the plurality of patterns may be arranged along a direction in which an edge of the insulating layer extends in a plan view.

In an embodiment, the display panel further may include a first dam disposed on the base layer and covered by the hydrophobic layer, and the plurality of patterns may overlap the first dam.

In an embodiment, the display panel further may include a second dam disposed on the base layer, and the second dam is spaced apart from the insulating layer with the first dam interposed therebetween.

In an embodiment, the second dam may be covered by the hydrophobic layer.

In an embodiment, the display panel further may include a second dam disposed on the base layer and overlapping the insulating layer in a plan view, and the second dam may not overlap the hydrophobic layer.

An embodiment of the invention provides an electronic device including a display panel, and an input sensor disposed on the display panel and including an insulating layer and a conductive layer. The display panel includes a base layer, a plurality of light-emitting elements disposed on the base layer, a hydrophobic layer disposed on the base layer and spaced apart from the light-emitting elements, an encapsulation layer disposed on the light-emitting elements and including a first inorganic layer, a second inorganic layer, and an organic layer disposed between the first inorganic layer and the second inorganic layer, and a plurality of patterns disposed on the hydrophobic layer. The organic layer includes an upper surface and an inclined surface inclined with respect to the upper surface, and the plurality of patterns is spaced apart from the inclined surface.

In an embodiment, the conductive layer of the input sensor may include sensing electrodes and sensing signal lines connected to the sensing electrodes, and the sensing electrodes and the sensing signal lines overlap the upper surface of the organic layer.

In an embodiment, the insulating layer of the input sensor may contact the second inorganic layer.

In an embodiment, each of the plurality of patterns may include a lower surface that contacts the hydrophobic layer and a curved surface protruded from the lower surface in a cross-section.

In an embodiment, the first inorganic layer may be disposed under the hydrophobic layer, and the second inorganic layer may cover the hydrophobic layer and the plurality of patterns.

In an embodiment, the display panel further may include a dam disposed on the base layer and covered by the hydrophobic layer.

According to the above, the deposition position and the inclination angle at an end of the organic layer of the encapsulation layer are controlled, and the size of the flat upper surface provided by the organic layer increases in the display panel. Thus, the dead space in the display panel is reduced. In the display panel, the deposition position of the organic layer of the encapsulation layer is monitored using the plurality of patterns disposed on the hydrophobic layer.

According to the above, the electronic device includes the display panel with the reduced dead space, and thus, a bezel area of the electronic device is reduced. In addition, the organic layer of the encapsulation layer disposed adjacent to an edge area of the electronic device provides the flat upper surface, and thus, a sensitivity of the input sensor disposed adjacent to the edge area is improved.

BRIEF DESCRIPTION OF THE DRAWINGS

The above and other advantages of the invention will become readily apparent by reference to the following detailed description when considered in conjunction with the accompanying drawings, in which.

DETAILED DESCRIPTION

Figure 1:
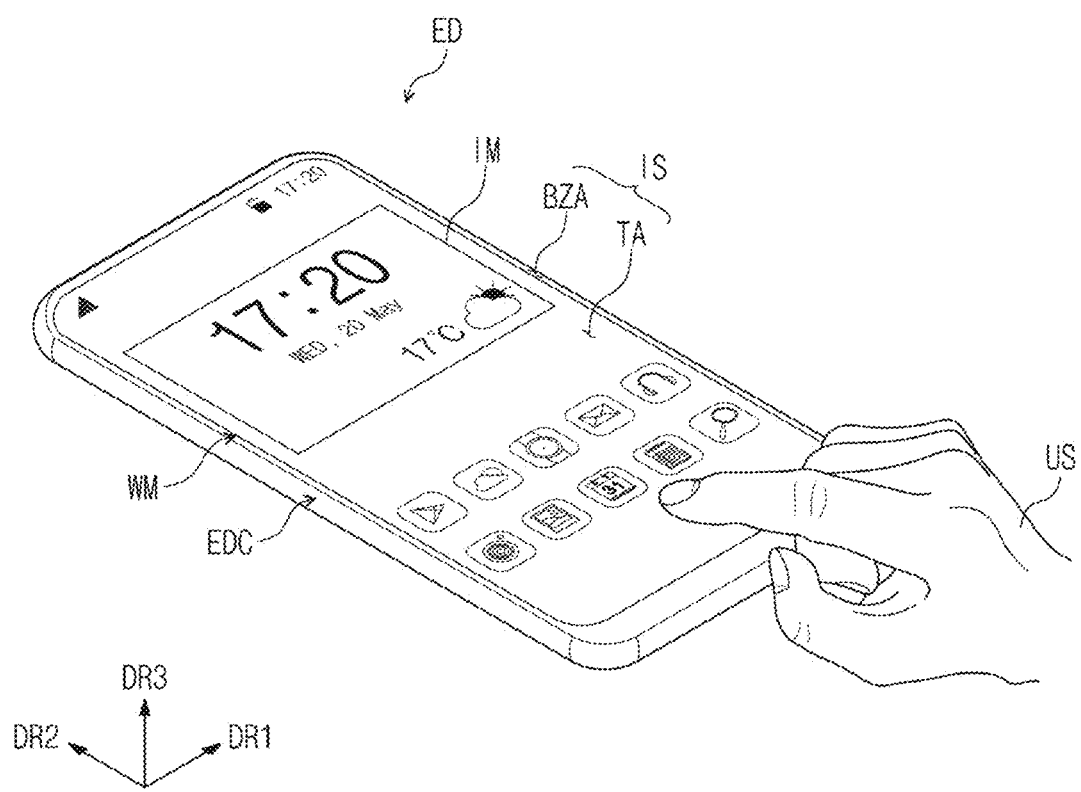
FIG. 1 is a perspective view of an embodiment of an electronic device according to the invention.

Embodiments of the invention may be variously modified and realized in many different forms, acid thus specific embodiments will be exemplified in the drawings and described in detail hereinbelow. However, the invention should not be limited to the specific disclosed forms, and be construed to include all modifications, equivalents, or replacements included in the spirit and scope of the invention.

In the disclosure, it will be understood that when an element or layer is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" may include any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another elements or features as shown in the drawing figures.

It will be further understood that the terms "may include" and/or "including", when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the invention will be described with reference to accompanying drawings.

FIG. 1 is a perspective view of an embodiment of an electronic device ED according to the invention.

The electronic device ED may be activated in response to electrical signals and may display an image IM. In an embodiment, the electronic device ED may be applied to a large-sized electronic item, such as a television set, an outdoor billboard, etc., and a small and medium-sized electronic item, such as a monitor, a mobile phone, a tablet computer, a navigation device, a game device, etc. However, these are merely some of embodiments, and the electronic device ED may be applied to other electronic devices as long as they do not depart from the concept of the invention. In the illustrated embodiment, the mobile phone is shown in an embodiment of the electronic device ED.

The electronic device ED of the invention may be flexible. The term "flexible" used herein refers to the property of being able to be bent from a structure that is completely bent to a structure that is bent at the scale of a few nanometers. In an embodiment, the electronic device ED may be a curved electronic device or a foldable electronic device, for example. In an embodiment, the electronic device ED may be rigid.

Referring to FIG. 1, the electronic device ED may have a quadrangular (e.g., rectangular) shape defined by short sides extending in a first direction DR1 and long sides extending in a second direction DR2 crossing the first direction DR1. However, the shape of the electronic device ED should not be limited to the quadrangular (e.g., rectangular) shape, and the electronic device ED may have a variety of shapes, such as a circular shape and a polygonal shape in a plan view.

The electronic device ED may display the image IM through a display surface IS toward a third direction DR3 substantially perpendicular to a plane defined by the first direction DR1 and the second direction DR2. The image IM provided from the electronic device ED may include a still image as well as a video. FIG. 1 shows a clock widget and application icons as an illustrative embodiment of the image IM.

The display surface IS through which the image IM is displayed may correspond to a front surface of the electronic device ED and a front surface of a window WM. Hereinafter, the front surface of the window WM will be assigned with the same reference numeral as that of the display surface IS. FIG. 1 shows a flat display surface IS, however, in another embodiment, the display surface IS of the electronic device ED may have a curved shape bent from at least one side of the plane.

Front (or upper) surface and rear (or lower) surface of each member (or each unit) of the electronic device ED may be opposite to each other in the third direction DR3, and a normal line direction of each of the front and rear surfaces may be substantially parallel to the third direction DR3. A separation distance between the front and rear surfaces of each member (or each unit) in the third direction DR3 may correspond to a thickness in the member (or the unit). In the invention, the expression "in a plan view" may mean a state of being viewed in the third direction DR3. In the disclosure, the expression "in a cross-section" may mean a state of being viewed in the first direction DR1 or the second direction DR2. Directions indicated by the first, second, and third directions DR1, DR2, and DR3 are relative to each other, and thus, the directions indicated by the first, second, and third directions DR1, DR2, and DR3 may be changed to other directions.

The electronic device ED may sense an external input applied thereto from the outside. The external input may include a variety of external inputs provided from the outside of the electronic device ED. In an embodiment, the external inputs may include force, pressure, temperature, light, etc., for example. The external inputs may include an external input (e.g., a hovering input) applied when in close proximity to or approaching close to the electronic device ED at a predetermined distance as well as a touch input (e.g., a hand of a user or an instrument such as a pen).

In the illustrated embodiment, the touch input by the user US that is applied to the front surface of the electronic device ED is shown as an illustrative embodiment of the external input. However, this is merely one of embodiments, and the external input may include all inputs causing a change on a capacitance and should not be particularly limited. In addition, the area of the electronic device ED in which the external input is sensed should not be limited to the front surface of the electronic device ED. The electronic device ED may sense the input by the user US applied to a side or rear surface of the electronic device ED depending on its design.

Referring to FIG. 1, the electronic device ED may include the window WM and a case EDC. The window WM and the case EDC may be coupled to each other to form an outer shape of the electronic device ED and may provide an inner space in which components of the electronic device ED are accommodated. In an embodiment, the components of the electronic device ED, such as a display panel, an input sensor, a protective member, an electronic module, etc., may be accommodated between the window WM and the case EDC.

The front surface IS of the window WM may include a transmission area TA and a bezel area BZA. The transmission area TA may be an optically transparent area. Accordingly, the image IM provided from the electronic device ED may be displayed through the transmission area TA, and the user US may view the image IM. In the illustrated embodiment, the transmission area TA has a quadrangular shape with rounded vertices, however, this is merely one of embodiments. The transmission area TA may have a variety of shapes and should not be particularly limited.

The bezel area BZA may be defined adjacent to the transmission area TA. In an embodiment, the bezel area BZA may be disposed outside the transmission area TA and may surround the transmission area TA. Accordingly, the transmission area TA may have a shape defined by the bezel area BZA. However, this is merely one of embodiments, and the bezel area BZA may be disposed adjacent to only one side of the transmission area TA or may be omitted. In addition, the bezel area BZA may be disposed at a side surface of the electronic device ED rather than the front surface of the electronic device ED.

The bezel area BZA may have a predetermined color and may block the light. The bezel area BZA of the window WM may prevent components of the electronic device ED, which overlap the bezel area BZA, from being viewed from the outside.

The case EDC may include a glass, plastic, or metal material having a relatively high rigidity. The case EDC may protect the components accommodated therein. To this end, the case EDC may absorb impacts applied thereto from the outside and may prevent a foreign substance and moisture from entering the components of the electronic device ED accommodated in the case EDC. In an embodiment, the case EDC may be provided in a form obtained by coupling a plurality of accommodating members.

Figure 2:
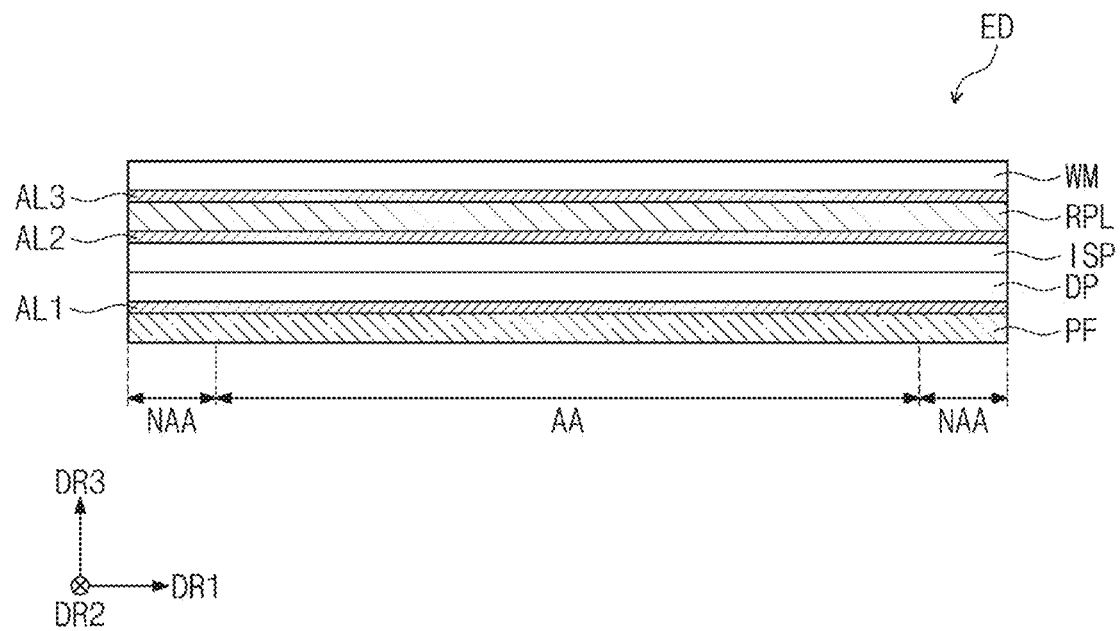
FIG. 2 is a cross-sectional view of an embodiment of an electronic device according to the invention.

FIG. 2 is a cross-sectional view of an embodiment of the electronic device ED according to the invention. FIG. 2 schematically shows a stack structure of the components of the electronic device ED.

Referring to FIG. 2, the electronic device ED may include a display panel DP, an input sensor ISP, a protective member PF, an anti-reflective layer RPL, the window WM, and first, second, and third adhesive layers AL1, AL2, and AL3. The components of the electronic device ED, such as the display panel DP, the input sensor ISP, the protective member PF, the anti-reflective layer RPL, etc., may be disposed between the window WM and the case EDC (refer to FIG. 1) and may be accommodated in the case EDC (refer to FIG. 1).

The electronic device ED may include an active area AA and a peripheral area NAA. The active area AA may be electrically activated. The electronic device ED may display an image through the active area AA and may sense the external input through the active area AA. The active area AA may correspond to the transmission area TA.

The peripheral area NAA may be an area in which elements used to activate the active area AA are disposed. The peripheral area NAA may be defined adjacent to the active area AA. In an embodiment, the peripheral area NAA may surround the active area AA. The peripheral area NAA may correspond to the bezel area BZA.

In the following descriptions, the expression "an area/portion corresponds to another area/portion" means that "an area/portion overlaps another area/portion", but the expression should not be limited to "an area/portion has the same area and/or the same shape as another area/portion".

The display panel DP may display the image in response to the electrical signals. In an embodiment, the display panel DP may be a light-emitting type display panel, however, it should not be particularly limited. In embodiments, the display panel DP may be an organic light-emitting display panel, an inorganic light-emitting display panel, or a quantum dot light-emitting display panel, for example. A light-emitting layer of the organic light-emitting display panel may include an organic light-emitting material. A light-emitting layer of the inorganic light-emitting display panel may include an inorganic light-emitting material. A light-emitting layer of the quantum dot light-emitting display panel may include a quantum dot and/or a quantum rod. Hereinafter, the organic light-emitting display panel will be described as an illustrative embodiment of the display panel DP.

The input sensor ISP may be disposed on the display panel DP. The input sensor ISP may be disposed directly on the display panel DP without a separate adhesive member. That is, the input sensor ISP may be formed on a base surface provided by the display panel DP through successive processes after the display panel DP is formed, however, it should not be limited thereto or thereby. In an embodiment, the input sensor ISP may be attached to an upper surface of the display panel DP by an adhesive member after being manufactured through a separate process from the display panel DP.

The input sensor ISP may sense an external input applied thereto from the outside and may obtain coordinate information about the external input. The input sensor ISP may operate in various manners, such as a capacitive manner, a resistive manner, an infrared manner, or a pressure manner, and should not be particularly limited.

The protective member PF may be disposed on a rear surface of the display panel DP. The protective member PF may include at least one of a protective film layer, an impact absorbing layer, and a support plate layer to protect the display panel DP from external impacts.

The protective film layer may include a polymer material with flexibility, such as polyethylene terephthalate, polyimide, or the like, and may protect the display panel DP. The impact absorbing layer may include a sponge, a foam, or a urethane resin and may absorb the external impacts applied to the display panel DP. The support plate layer may include a metal material with a relatively high rigidity, such as stainless steel, aluminum, or any alloys thereof, and may support the display panel DP under the display panel DP. However, materials for the protective member PF should not be particularly limited as long as the protective member PF may protect the display panel DP.

The anti-reflective layer RPL may be disposed on the input sensor ISP. The anti-reflective layer RPL may reduce a reflectance with respect to an external light incident thereto from above the electronic device ED.

In an embodiment, the anti-reflective layer RPL may include a retarder and/or a polarizer. The retarder may include a λ/2 retarder and/or a λ/4 retarder. However, the invention is not limited thereto, and the retarder may include various other wave retarders. The polarizer may be a film type or liquid crystal coating type. The film type polarizer may include a stretching type synthetic resin film, and the liquid crystal coating type polarizer may include liquid crystals aligned in a predetermined alignment. However, the retarder and the polarizer should not be limited thereto or thereby, and the retarder and the polarizer may be implemented as one polarizing film.

In an embodiment, the anti-reflective layer RPL may include color filters. The color filters may be arranged by taking into account arrangements and emission colors of the pixels included in the display panel DP. The color filters may receive the external light and may filter the external light to the same color as the emission colors of the pixels. The anti-reflective layer RPL may further include a black matrix disposed adjacent to the color filters.

In an embodiment, the anti-reflective layer RPL may include a destructive interference structure. In an embodiment, the destructive interference structure may include a first reflection layer and a second reflection layer, which are disposed in different layers from each other, for example. A first reflection light and a second reflection light, which are respectively reflected by the first reflection layer and the second reflection layer, may be destructively interfered, and thus, the anti-reflective layer RPL may reduce the reflectance with respect to the external light.

The window WM may be disposed on the display panel DP. The window WM may have a shape corresponding to a shape of the display panel DP. The window WM may cover an entirety of a front surface of the display panel DP and may protect the display panel DP from external impacts and scratches.

The window WM may include an optically transparent insulating material. In an embodiment, the window WM may include a glass, sapphire, or polymer. The window WM may have a single-layer or multi-layer structure. The window WM may further include a functional layer, such as an anti-fingerprint layer, a phase control layer, a hard coating layer, etc., disposed on an optically transparent substrate.

The first adhesive layer AL1 may be disposed between the display panel DP and the protective member PF, and the display panel DP and the protective member PF may be coupled to each other by the first adhesive layer AL1. The second adhesive layer AL2 may be disposed between the anti-reflective layer RPL and the input sensor ISP, and the anti-reflective layer RPL and the input sensor ISP may be coupled to each other by the second adhesive layer AL2. The third adhesive layer AL3 may be disposed between the window WM and the anti-reflective layer RPL, and the window WM and the anti-reflective layer RPL may be coupled to each other by the third adhesive layer AL3. In an embodiment, at least one of the first, second, and third adhesive layers AL1, AL2, and AL3 may be omitted.

Each of the first, second, and third adhesive layers AL1, AL2, and AL3 may include a transparent adhesive, such as an optically clear adhesive ("OCA") film, an optically clear resin ("OCR"), or a pressure sensitive adhesive ("PSA") film, however, the adhesive included in the first, second, and third adhesive layers AL1, AL2, and AL3 should not be limited thereto or thereby.

The electronic device ED may further include an electronic module including a variety of functional modules to drive the display panel DP and a power supply module supplying a power desired for an overall operation of the electronic device ED. In an embodiment, the electronic device ED may include a camera module as an illustrative embodiment of the electronic module.

Figure 3:
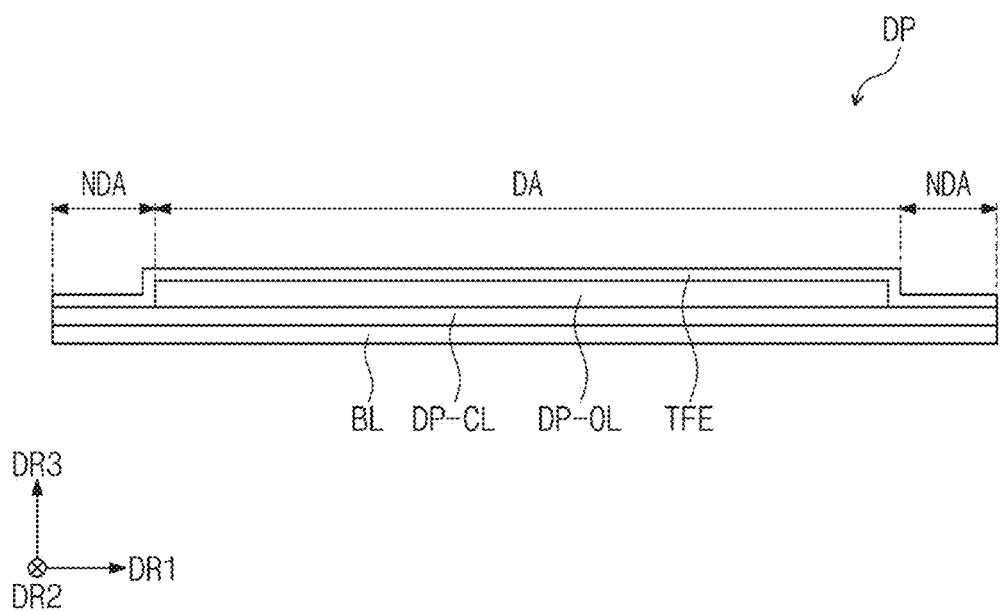
FIG. 3 is a cross-sectional view of an embodiment of a display panel according to the invention.
Figure 4:
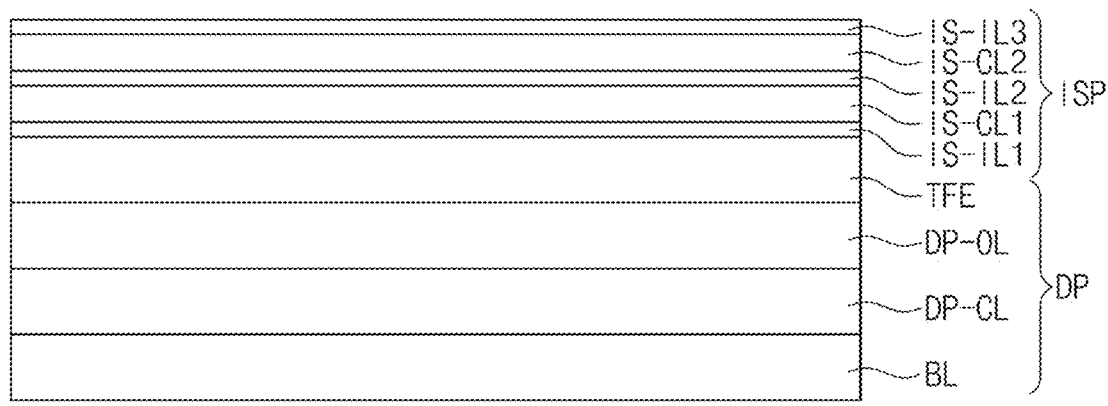
FIG. 4 is a cross-sectional view of an embodiment of a display panel and an input sensor according to the invention.
Figure 4:
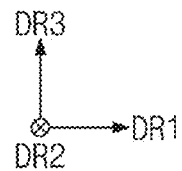

FIG. 3 is a cross-sectional view of an embodiment of the display panel DP in an embodiment of the invention, and FIG. 4 is a cross-sectional view of an embodiment of the display panel DP and the input sensor ISP according to the invention. Referring to FIGS. 3 and 4, the display panel DP may include a base layer BL, a circuit layer DP-CL, a display element layer DP-OL, and an encapsulation layer TFE.

The base layer BL may include a display area DA and a non-display area NDA. The base layer BL may provide a base surface on which the circuit layer DP-CL is disposed. The base layer BL may be a rigid substrate, however, it should not be limited thereto or thereby. In an embodiment, the base layer BL may be a flexible substrate.

The circuit layer DP-CL may be disposed on the base layer BL. The circuit layer DP-CL may include at least one insulating layer, driving elements, signal lines, and signal pads.

The display element layer DP-OL may be disposed on the circuit layer DP-CL. The display element layer DP-OL may include light-emitting elements overlapping the display area DA. The light-emitting elements of the display element layer DP-OL may be electrically connected to the driving elements of the circuit layer DP-CL and may provide a source light via the display area DA in response to a signal from the driving elements.

The display area DA of the display panel DP may be activated in response to electrical signals, and the image may be displayed through the display area DA. In an embodiment, the display area DA of the display panel DP may correspond to the transmission area TA (refer to FIG. 1) of the window WM and the active area AA (refer to FIG. 2) of the electronic device ED.

In an embodiment, a driving circuit or a driving line to drive the elements disposed in the display area DA, various signal lines to provide electrical signals to the elements, and pads may be disposed in the non-display area NDA. The non-display area NDA of the display panel DP may correspond to the bezel area BZA of the window WM and the peripheral area NAA of the electronic device ED. Components of the display panel DP, which are disposed in the non-display area NDA, may be prevented from being viewed from the outside by the bezel area BZA.

The encapsulation layer TFE may be disposed on the display element layer DP-OL and may encapsulate the light-emitting elements. The encapsulation layer TFE may include a plurality of insulating layers. The insulating layers of the encapsulation layer TFE may improve an optical efficiency of the light-emitting elements or to protect the light-emitting elements.

Referring to FIG. 4, the input sensor ISP may include a first insulating layer IS-IL1, a first conductive layer IS-CL1, a second insulating layer IS-IL2, a second conductive layer IS-CL2, and a third insulating layer IS-IL3. The first insulating layer IS-IL1 of the input sensor ISP may be disposed directly on the encapsulation layer TFE. However, in another embodiment, the first insulating layer IS-IL1 of the input sensor ISP may be omitted.

Each of the first conductive layer IS-CL1 and the second conductive layer IS-CL2 may have a single-layer structure or a multi-layer structure. The conductive layer having the multi-layer structure may include two or more layers of a transparent conductive layer and a metal layer. The conductive layer having the multi-layer structure may include metal layers including different metals from each other.

In an embodiment, the first and second conductive layers IS-CL1 and IS-CL2 may include at least one of indium tin oxide ("ITO"), indium zinc oxide ("IZO"), zinc oxide (ZnO), indium tin zinc oxide ("ITZO"), poly(3,4-ethylene-dioxythiophene) ("PEDOT"), metal nanowire, and graphene as the transparent conductive layer. In an embodiment, the first and second conductive layers IS-CL1 and IS-CL2 may include molybdenum, silver, titanium, copper, aluminum, and alloys thereof as the metal layer. In an embodiment, each of the first and second conductive layers IS-CL1 and IS-CL2 may have a three-layer structure of titanium/aluminum/titanium. Metals with a relatively high durability and a low reflectance may be applied as an outer layer of the conductive layer, and metals with a high electrical conductivity may be applied as an inner layer of the conductive layer.

The first conductive layer IS-CL1 and the second conductive layer IS-CL2 may include sensing patterns of the input sensor ISP described later. The sensing patterns may include sensing electrodes and sensing signal lines connected to of the sensing electrodes.

Each of the first, second, and third insulating layers IS-IL1, IS-IL2, and IS-IL3 may include an inorganic layer or an organic layer. In an embodiment, the inorganic layer may include at least one of aluminum oxide, titanium oxide, silicon oxide, silicon oxynitride, zirconium oxide, and hafnium oxide. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin. However, materials for the first, second, and third insulating layers IS-IL1, IS-IL2, and IS-IL3 should not be limited thereto or thereby.

In an embodiment, each of the first and second insulating layers IS-IL1 and IS-IL2 may include the inorganic layer, and the third insulating layer IS-IL3 may include the organic layer.

Figure 5:
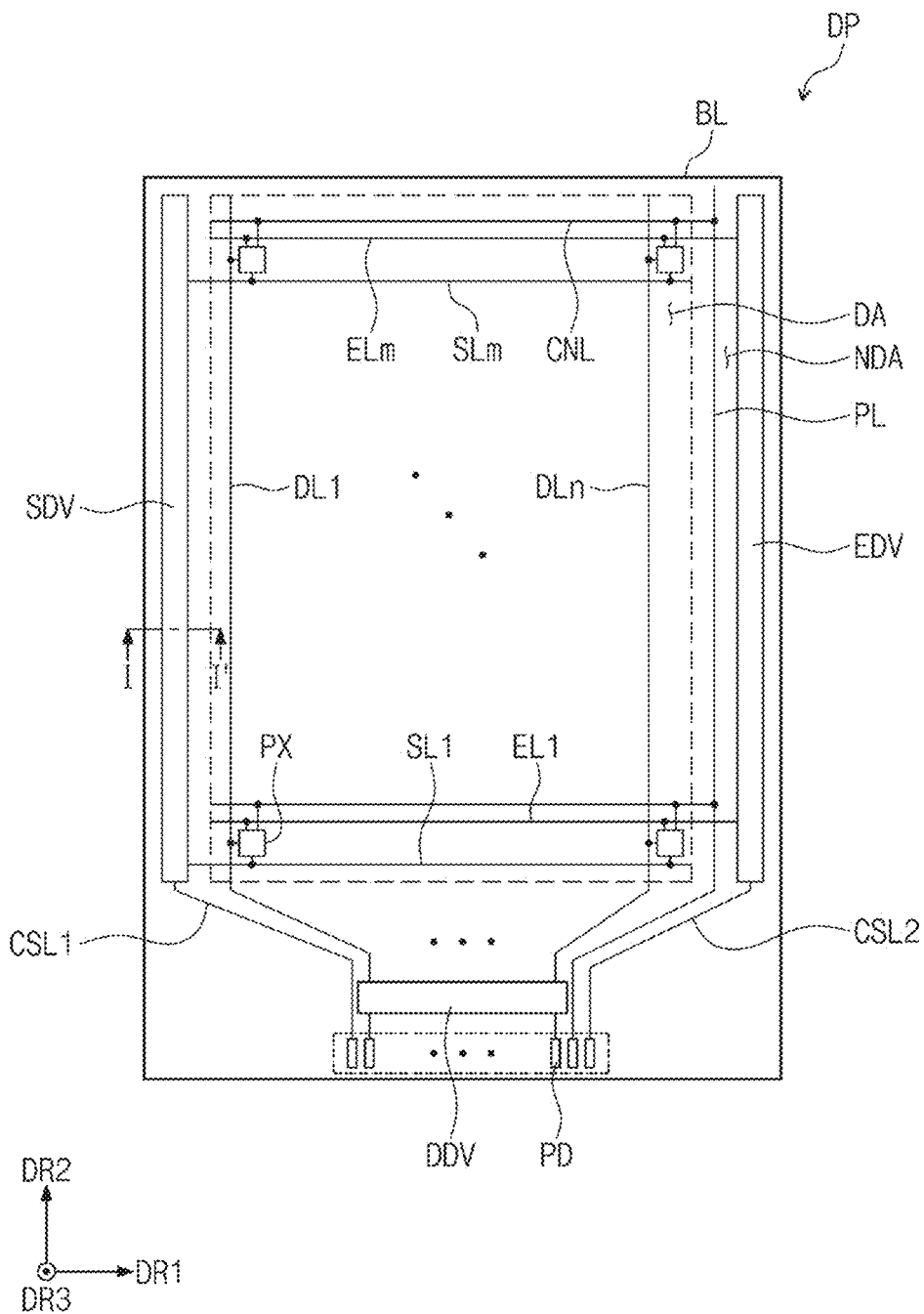
FIG. 5 is a plan view of an embodiment of a display panel according to the invention.

FIG. 5 is a plan view of an embodiment of the display panel DP according to the invention. FIG. 5 shows some of the components of the display panel DP in a plan view.

Referring to FIG. 5, the display panel DP may include the base layer BL, the pixels PX, the signal lines electrically connected to the pixels PX, a scan driver SDV, a data driver DDV, and an emission driver EDV.

As described above, the base layer BL may include the display area DA and the non-display area NDA. The base layer BL may provide the base surface on which electrical elements and signal lines of the display panel DP are disposed. In FIG. 5, the base layer BL has a quadrangular (e.g., rectangular) shape substantially parallel to the first direction DR1 and the second direction DR2 in a plan view, however, the shape of the base layer BL should not be limited thereto or thereby. In an embodiment, the base layer BL may be designed in various ways depending on the structure of the electronic device ED.

Each of the pixels PX may include a pixel driving circuit configured to a light-emitting element, a plurality of transistors connected to the light-emitting element (e.g., a switching transistor, a driving transistor, etc.), and at least one capacitor. Each of the pixels PX may emit a light in response to an electrical signal applied thereto. The pixels PX may be arranged in the display area DA, however, this is merely one of embodiments. In an embodiment, thin film transistors of some pixels among the pixels PX may be disposed in the non-display area NDA.

Each of the scan driver SDV, the data driver DDV, and the emission driver EDV may be disposed in the non-display area NDA of the display panel DP. In an embodiment, the scan driver SDV and the emission driver EDV may be disposed in the non-display area NDA to be respectively adjacent to long sides of the base layer BL. The data driver DDV may be disposed in the non-display area NDA to be adjacent to one short side of the base layer BL. However, they should not be limited thereto or thereby. In an embodiment, at least one of the scan driver SDV, the data driver DDV, and the emission driver EDV may overlap the display area DA. Therefore, a size of the non-display area NDA may be reduced, and the bezel area BZA of the electronic device ED may be reduced.

The data driver DDV may be manufactured in an integrated circuit chip form and may be disposed (e.g., mounted) on the non-display area NDA of the display panel DP, however, it should not be limited thereto or thereby. In an embodiment, the data driver DDV may be electrically connected to the display panel DP after being disposed (e.g., mounted) on a separate flexible circuit board connected to the display panel DP.

In an embodiment, at least a portion of the non-display area NDA of the display panel DP may be bent. In an embodiment, the display panel DP may be bent such that a portion of the non-display area NDA in which the data driver DDV is disposed may overlap a portion of the display panel DP in which the display area DA is defined in a plan view, however, it should not be limited thereto or thereby. In an embodiment, the data driver DDV may be disposed (e.g., mounted) on a separate flexible circuit board, and the flexible circuit board may be bent to be connected to one end of the display panel DP. Accordingly, the bezel area BZA of the electronic device ED may be reduced.

The signal lines may include a plurality of scan lines SL1 to SLm, a plurality of data lines DL1 to DLn, a plurality of emission lines EL1 to ELm, first and second control lines CSL1 and CSL2, a power line PL, and a plurality of connection lines CNL. Each of m and n is a natural number.

Each of the pixels PX may be connected to a corresponding scan line among the scan lines SL1 to SLm, a corresponding data line among the data lines DL1 to DLn, and a corresponding emission line among the emission lines EL1 to ELm. More types of signal lines may be provided in the display panel DP depending on the configuration of the pixel driving circuit of the pixels PX.

The scan lines SL1 to SLm may extend in the first direction DR1 and may be connected to the scan driver SDV. The data lines DL1 to DLn may extend in the second direction DR2 and may be connected to the data driver DDV. The emission lines EL1 to ELm may extend in the first direction DR1 and may be connected to the emission driver EDV.

The power line PL may extend in the second direction DR2 and may be disposed in the non-display area NDA. The power line PL may be disposed between the display area DA and the emission driver EDV, however, it should not be limited thereto or thereby. In an embodiment, the power line PL may be disposed between the display area DA and the scan driver SDV, for example.

The connection lines CNL may extend in the first direction DR1 and may be arranged in the second direction DR2. The connection lines CNL may be connected to the power line PL and the pixels PX. The connection lines CNL may be disposed in a layer different from a layer in which the power line PL is disposed and may be electrically connected to the power line PL, however, they should not be limited thereto or thereby. In an embodiment, the connection lines CNL may be disposed in the same layer as the power line PL and may be unitary with the power line PL. A first voltage may be applied to the pixels PX via the power line PL and the connection lines CNL connected to the power line PL.

The first control line CSL1 may be connected to the scan driver SDV. The second control line CSL2 may be connected to the emission driver EDV.

The pads PD may be disposed adjacent to a lower end of the non-display area NDA. The pads PD may be disposed closer to the lower end of the display panel DP than the data driver DDV is. The pads PD may be arranged in the first direction DR1. The electronic device ED may include a circuit board including a timing controller to control an operation of the scan driver SDV, the data driver DDV, and the emission driver EDV and a voltage generator to generate a voltage, and the pads PD may be connected to the circuit board of the electronic device ED.

Each of the pads PD may be connected to a corresponding signal line among the signal lines. The power line PL and the first and second control lines CSL1 and CSL2 may be connected to the pads PD. The data lines DL1 to DLn may be connected to corresponding pads PD via the data driver DDV. In an embodiment, the data lines DL1 to DLn may be connected to the data driver DDV, and the data driver DDV may be connected to the pads PD respectively corresponding to the data lines DL1 to DLn.

The scan driver SDV may generate a plurality of scan signals in response to a scan control signal. The scan signals may be applied to the pixels PX via the scan lines SL1 to SLm. The data driver DDV may generate a plurality of data voltages corresponding to image signals in response to a data control signal. The data voltages may be applied to the pixels PX via the data lines DL1 to DLn. The emission driver EDV may generate a plurality of emission signals in response to an emission control signal. The emission signals may be applied to the pixels PX via the emission lines EL1 to ELm.

The pixels PX may receive the data voltages in response to the scan signals. The pixels PX may emit a light having a luminance corresponding to the data voltages in response to the emission signals, and thus, the image may be displayed. An emission time of the pixels PX may be controlled by the emission signals. Accordingly, the display panel DP may display the image through the display area DA using the pixels PX.

Figure 6:
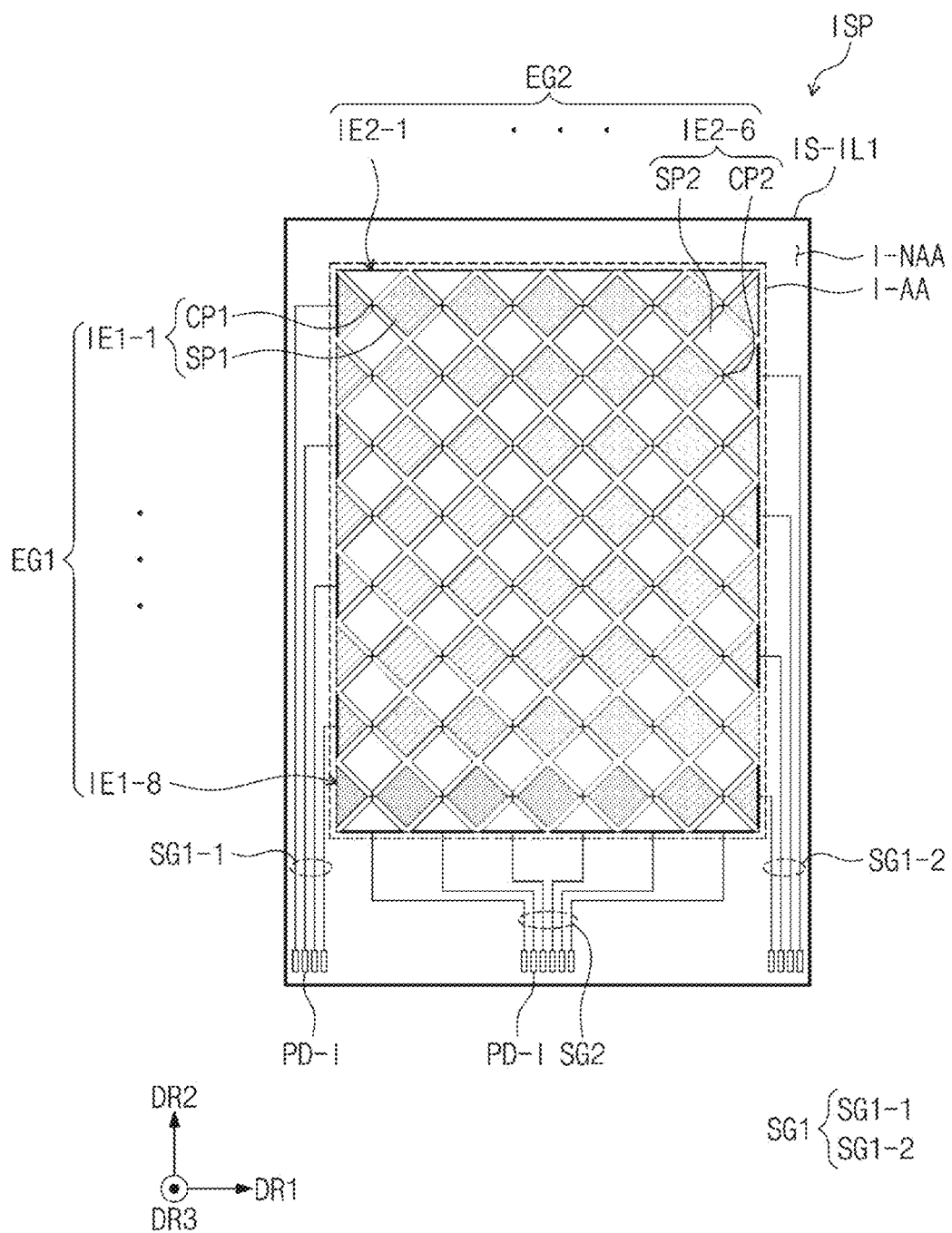
FIG. 6 is a plan view of an embodiment of an input sensor according to the invention.

FIG. 6 is a plan view of an embodiment of the input sensor ISP according to the invention. FIG. 6 shows some of components of the input sensor ISP in a plan view.

Referring to FIG. 6, the input sensor ISP may include the first insulating layer IS-IL1, a first electrode group EG1, a second electrode group EG2, a first sensing signal line group SG1 connected to the first electrode group EG1, and a second sensing signal line group SG2 connected to the second electrode group EG2. The shape of the first electrode group EG1 and the shape of the second electrode group EG2 shown in FIG. 6 are merely some of embodiments, and the shapes of the first and second electrode groups EG1 and EG2 may be designed in various ways depending on the structure and use of the electronic device ED.

The first insulating layer IS-IL1 may provide a base surface on which the sensing electrodes and the sensing signal lines of the input sensor ISP are disposed. However, in another embodiment, the first insulating layer IS-IL1 of the input sensor ISP may be omitted, and in this case, the sensing electrodes and the sensing signal lines of the input sensor ISP may be disposed on the base surface provided by the display panel DP. FIG. 6 shows the first insulating layer IS-IL1 having a quadrangular (e.g., rectangular) shape parallel to each of the first direction DR1 and the second direction DR2 in a plan view, however, the shape of the first insulating layer IS-IL1 should not be limited to the quadrangular (e.g., rectangular) shape. The shape of the first insulating layer IS-IL1 may be designed in various ways according to the shape of the base layer BL (refer to FIG. 5) of the display panel DP (refer to FIG. 5).

The first insulating layer IS-IL1 may include a sensing area I-AA and a line area I-NAA. The sensing area I-AA may be an area in which the external input provided from the outside of the electronic device ED is sensed. The line area I-NAA may be an area in which the sensing signal lines providing electrical signals to activate the sensing area I-AA are disposed. The sensing area I-AA may correspond to the display area DA of the display panel DP, and the line area I-NAA may correspond to the non-display area NDA of the display panel DP.

In the illustrated embodiment, the input sensor ISP may be, but not limited to, a sensor operated in a capacitive type. The input sensor ISP may obtain information on the external input based on a variation in capacitance between the first electrode group EG1 and the second electrode group EG2. One group of the first electrode group EG1 and the second electrode group EG2 may receive a driving signal, and the other group of the first electrode group EG1 and the second electrode group EG2 may output the variation in capacitance between the first electrode group EG1 and the second electrode group EG2 as a sensing signal. However, this is merely one of embodiments. The driving manner of the input sensor ISP of the electronic device ED should not be limited thereto or thereby.

The first electrode group EG1 and the second electrode group EG2 may be disposed in the sensing area I-AA. The first electrode group EG1 may include first sensing electrodes IE1-1 to IE1-8. The second electrode group EG2 may include second sensing electrodes IE2-1 to IE2-6. FIG. 6 shows the first electrode group EG1 including eight first sensing electrodes IE1-1 to IE1-8 and the second electrode group EG2 including six second sensing electrodes IE2-1 to IE2-6, however, the number of the sensing electrodes should not be limited thereto or thereby.

The first sensing electrodes IE1-1 to IE1-8 may extend in the first direction DR1. Each of the first sensing electrodes IE1-1 to IE1-8 may form one row substantially parallel to the first direction DR1. The first sensing electrodes IE1-1 to IE1-8 may be arranged in the second direction DR2.

Each of the first sensing electrodes IE1-1 to IE1-8 may include first sensor portions SP1 and first connection portions CP1. The first sensor portions SP1 forming one first sensing electrode may be arranged in the first direction DR1. Each of the first connection portions CP1 may connect two first sensor portions SP1 adjacent to each other in the first direction DR1 among the first sensor portions SP1.

The second sensing electrodes IE2-1 to IE2-6 may extend in the second direction DR2. Each of the second sensing electrodes IE2-1 to IE2-6 may form one column substantially parallel to the second direction DR2. The second sensing electrodes IE2-1 to IE2-6 may be arranged in the first direction DR1.

Each of the second sensing electrodes IE2-1 to IE2-6 may include second sensor portions SP2 and second connection portions CP2. The second sensor portions SP2 forming one second sensing electrode may be arranged in the second direction DR2. Each of the second connection portions CP2 may connect two second sensor portions SP2 adjacent to each other in the second direction DR2 among the second sensor portions SP2.

A length or a size of the first sensing electrodes IE1-1 to IE1-8 and the second sensing electrodes IE2-1 to IE2-6 may be changed depending on an arrangement of the sensing electrodes and a size of the sensing area I-AA.

Each of the first sensor portions SP1, the second sensor portions SP2, the first connection portions CP1, and the second connection portions CP2 may have a conductivity. Each of the first sensor portions SP1, the second sensor portions SP2, the first connection portions CP1, and the second connection portions CP2 may be formed from the first conductive layer IS-CL1 (refer to FIG. 4) or the second conductive layer IS-CL2 (refer to FIG. 4).

FIG. 6 shows the first sensor portions SP1 and the second sensor portions SP2 each having a lozenge shape, however, this is merely one of embodiments. In an embodiment, each of the first sensor portions SP1 and the second sensor portions SP2 may have a variety of shapes. The first connection portions CP1 may be electrically insulated from the second connection portions CP2 while crossing the second connection portions CP2, however, they should not be limited thereto or thereby. In an embodiment, each of the first connection portions CP1 may be changed into a curved line form of a shape "Λ" obtained by rotating a V shape by about 180 degrees and/or a curved line form of a shape "v" similar to the V shape so as not to overlap the second connection portions CP2, for example.

The first sensing electrodes IE1-1 to IE1-8 and the second sensing electrodes IE2-1 to IE2-6 may overlap the display area DA (refer to FIG. 5) of the display panel DP (refer to FIG. 5) in a plan view. Accordingly, the first sensing electrodes IE1-1 to IE1-8 and the second sensing electrodes IE2-1 to IE2-6 may include an optically transparent conductive material. In addition, the first sensing electrodes IE1-1 to IE1-8 and the second sensing electrodes IE2-1 to IE2-6 may have a mesh pattern. The first sensing electrodes IE1-1 to IE1-8 and the second sensing electrodes IE2-1 to IE2-6 may be provided in various ways and should not be particularly limited as long as a visibility of the image displayed through the display panel DP is not deteriorated.

The first sensing signal line group SG1 and the second sensing signal line group SG2 may be disposed in the line area I-NAA.

The first sensing signal line group SG1 may include the same number of first sensing signal lines as the number of the first sensing electrodes IE1-1 to IE1-8. The first sensing signal lines may be connected to one ends of the first sensing electrodes IE1-1 to IE1-8, respectively.

In an embodiment, the first sensing signal line group SG1 may be divided into two groups respectively defined as a first side signal line group SG1-1 disposed at one side in the line area I-NAA and a second side signal line group SG1-2 disposed at an opposite side in the line area I-NAA opposite to the one side in the line area I-NAA. The first side signal line group SG1-1 may be connected to a left side of some sensing electrodes among the first sensing electrodes IE1-1 to IE1-8. The second side signal line group SG1-2 may be connected to a right side of remaining sensing electrodes, which are not connected to the first side signal line group SG1-1, among the first sensing electrodes IE1-1 to IE1-8. The first side signal line group SG1-1 and the second side signal line group SG1-2 may be spaced apart from each other with the sensing area I-AA interposed therebetween in the first direction DR1. As the first sensing signal lines of the first sensing signal line group SG1 are divided into two groups to be disposed at opposite sides, a width of the line area I-NAA may be reduced.

In detail, the first side signal line group SG1-1 may be electrically connected to the sensing electrodes forming odd-numbered rows among the first sensing electrodes IE1-1 to IE1-8, and the second side signal line group SG1-2 may be electrically connected to the sensing electrodes forming even-numbered rows among the first sensing electrodes IE1-1 to IE1-8. However, the arrangement of the first sensing signal lines of the first sensing signal line group SG1 should not be limited thereto or thereby. In an embodiment, the first sensing signal lines may be connected to opposite ends of the first sensing electrodes IE1-1 to IE1-8. In an embodiment, all the first sensing signal lines of the first sensing signal line group SG1 may be connected to left sides of the first sensing electrodes IE1-1 to IE1-8 or right sides of the first sensing electrodes IE1-1 to IE1-8 without being divided into two groups.

The second sensing signal line group SG2 may include the same number of second sensing signal lines as the number of the second sensing electrodes IE2-1 to IE2-6. The second sensing signal lines may be connected to one ends of the second sensing electrodes IE2-1 to IE2-6, respectively. Referring to FIG. 6, the second sensing signal lines of the second sensing signal line group SG2 may be connected to lower ends of the second sensing electrodes IE2-1 to IE2-6, respectively.

Each of the sensing signal lines of the first sensing signal line group SG1 and the second sensing signal line group SG2 may be connected to a corresponding sensing pad PD-I among sensing pads PD-I arranged in the first direction DR1. The sensing pads PD-I may be connected to the same circuit board to which the display panel DP is connected, or the sensing pads PD-I may be connected to a circuit board separated from the circuit board connected to the display panel DP and may be independently controlled.

The sensing pads PD-I may be disposed in a layer different from a layer in which the pads PD (refer to FIG. 5) of the display panel DP (refer to FIG. 5) are disposed, however, they should not be limited thereto or thereby. In an embodiment, the sensing pads PD-I may be disposed in the same layer as the layer on which the pads PD (refer to FIG. 5) of the display panel DP (refer to FIG. 5) are disposed, and ends of the sensing signal lines of the input sensor ISP may be electrically connected to sensing pads PD-I through contact holes, respectively.

Figure 7:
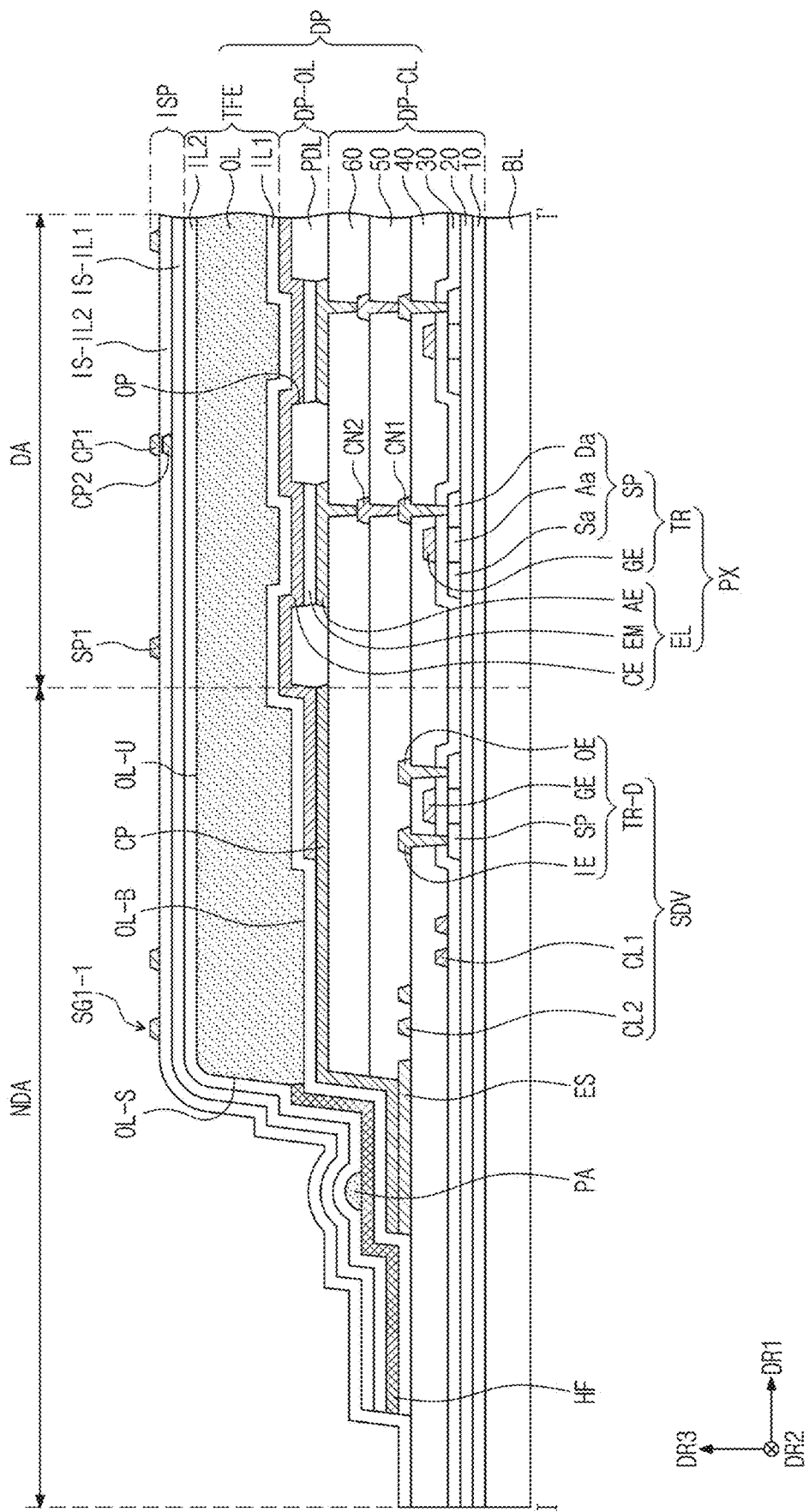
FIG. 7 is a cross-sectional view of an embodiment of a display panel and an input sensor according to the invention.
Figure 8A:
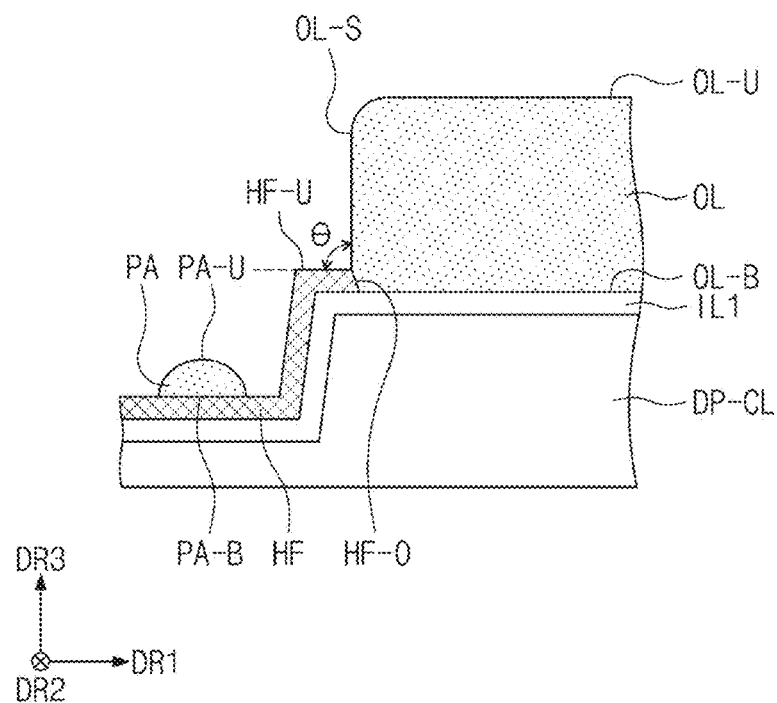
FIGS. 8A and 8B are enlarged cross-sectional views of a display panel according to the invention.
Figure 8B:
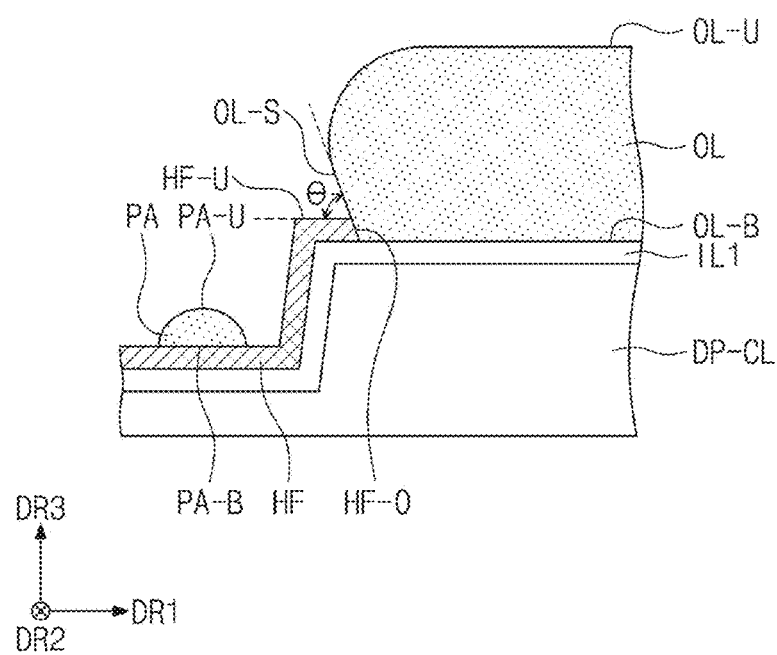

FIG. 7 is a cross-sectional view of the display panel DP and the input sensor ISP taken along line I-I' of FIG. 5 in an embodiment of the invention, and FIGS. 8A and 8B are enlarged cross-sectional views of the display panel DP according to the invention. FIG. 7 shows a cross-section of the display panel DP and the input sensor ISP corresponding to the display area DA and the non-display area NDA adjacent to the display area DA.

Referring to FIG. 7, the display panel DP may include the base layer BL, the circuit layer DP-CL, the display element layer DP-OL, and the encapsulation layer TFE. Details of the components of the display panel DP described above may be applied to the components of the display panel DP shown in FIG. 7.

The base layer BL may include a glass substrate, a metal substrate, a polymer substrate, or an organic/inorganic composite material substrate. The base layer BL may include a synthetic resin layer. In an embodiment, the synthetic resin layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, a perylene-based resin, and a polyimide-based resin.

The circuit layer DP-CL may be disposed on the base layer BL. The circuit layer DP-CL may include at least one insulating layer, a conductive pattern, and a semiconductor pattern. An insulating layer, a semiconductor layer, and a conductive layer may be formed on the base layer BL by a coating or depositing process during a manufacturing process of the display panel DP. Then, the insulating layer, the semiconductor layer, and the conductive layer may be selectively patterned through several photolithography processes. After the processes are completed, the semiconductor pattern, the conductive pattern, and the signal line included in the circuit layer DP-CL may be formed.

FIG. 7 shows first, second, third, fourth, fifth, and sixth insulating layers 10 to 60 included in the circuit layer DP-CL and the semiconductor pattern and the conductive pattern, which are disposed between the base layer BL and the first to sixth insulating layers 10 to 60. However, the cross-section of the circuit layer DP-CL shown in FIG. 7 is merely one of embodiments, and the stack structure of the circuit layer DP-CL may be changed in various ways depending on processes, a process method, or the configuration of the pixels.

The first insulating layer 10 may be disposed on the base layer BL. The first insulating layer 10 may include an inorganic layer and may be provided on the base layer BL as a barrier layer. The first insulating layer 10 provided as the barrier layer may prevent a foreign substance from entering thereto from the outside. The first insulating layer 10 may include at least one of a silicon oxide layer and a silicon nitride layer. In an embodiment, the first insulating layer 10 provided as the barrier layer may include silicon oxide layers and silicon nitride layers alternately stacked with the silicon oxide layers.

The second insulating layer 20 may be disposed on the first insulating layer 10. The second insulating layer 20 may include an inorganic layer and may be provided as a buffer layer on the base layer BL. The second insulating layer 20 provided as the buffer layer may increase a coupling force between the base layer BL and the semiconductor pattern or the conductive pattern. The second insulating layer 20 may include at least one of a silicon oxide layer and a silicon nitride layer, and the second insulating layer 20 provided as the buffer layer may include silicon oxide layers and silicon nitride layers alternately stacked with the silicon oxide layers.

The pixels PX may be disposed on the second insulating layer 20. Each of the pixels PX may have an equivalent circuit including a transistor TR, at least one capacitor, and a light-emitting element EL, and the equivalent circuit of the pixel PX may be changed in various ways. The semiconductor pattern may be arranged with a predetermined rule over the pixels PX according to the equivalent circuit of the pixel PX. FIG. 7 shows some components of the pixel PX as an illustrative embodiment.

The transistor TR may include a semiconductor pattern SP and a gate GE. The semiconductor pattern SP may be disposed on the second insulating layer 20. The semiconductor pattern SP may include a silicon semiconductor and may include a crystalline silicon semiconductor, a polysilicon semiconductor, or an amorphous silicon semiconductor, however, it should not be limited thereto or thereby. The semiconductor pattern SP may include an oxide semiconductor. The semiconductor pattern SP may include a variety of materials as long as the semiconductor pattern SP has a semiconductor property, and it should not be particularly limited.

A source Sa, a drain Da, and a channel Aa of the transistor TR may be formed from the semiconductor pattern SP. The semiconductor pattern SP may include a plurality of areas distinguished from each other depending on a conductivity. In an embodiment, the semiconductor pattern SP may have different electrical properties depending on whether or not it is doped (e.g., whether it is doped with an N-type dopant or a P-type dopant), or whether a metal oxide is reduced. A portion of the semiconductor pattern SP, which has a relatively high conductivity, may serve as an electrode or a signal line and may correspond to the source Sa and the drain Da of the transistor TR. A non-doped or non-reduced portion of the semiconductor pattern SP, which has a relatively low conductivity, may correspond to the channel Aa (or an active) of the transistor TR.

The semiconductor pattern SP may include a first region with high conductivity and a second region with low conductivity. The first region may be doped with the N-type dopant or the P-type dopant. A P-type transistor may include a doped region doped with the P-type dopant, and an N-type transistor may include a doped region doped with the N-type dopant. The second region may be a non-doped region or may be doped at a concentration lower than the first region.

In an embodiment, the semiconductor pattern SP may include a plurality of areas distinguished from each other depending on whether a metal oxide is reduced. An area (hereinafter, also referred to as a reduced area) in which the metal oxide is reduced has a conductivity greater than that of an area (hereinafter, also referred to as a non-reduced area) in which the metal oxide is not reduced. The reduced area may substantially act as electrodes of the transistor TR, and the non-reduced area may substantially correspond to the channel Aa of the transistor TR.

The third to sixth insulating layers 30 to 60 may be stacked on the semiconductor pattern SP. The third to sixth insulating layers 30 to 60 may include an inorganic layer or an organic layer. In an embodiment, the inorganic layer may include at least one of aluminum oxide, titanium oxide, silicon oxide, silicon nitride, silicon oxynitride, zirconium oxide, and hafnium oxide. In an embodiment, the organic layer may include a phenolic-based polymer, an acrylic-based polymer, an imide-based polymer, an aryl ether-based polymer, an amide-based polymer, a fluorine-based polymer, a p-xylene-based polymer, a vinyl alcohol-based polymer, or any combinations thereof. However, the material for the insulating layer should not be limited thereto or thereby.

The third insulating layer 30 may be disposed on the second insulating layer 20 and may cover the semiconductor pattern SP. The third insulating layer 30 may be disposed between the semiconductor pattern SP and the gate GE of the transistor TR. In an embodiment, the third insulating layer 30 may be an inorganic layer having a single-layer or multiple-layer structure.

The gate GE may be disposed on the third insulating layer 30. The gate GE may be a portion of the conductive pattern of the circuit layer DP-CL. In a plan view, the gate GE may overlap the channel Aa of the transistor TR. The gate GE may serve as a mask in a process of doping the semiconductor pattern SP.

The transistor TR of FIG. 7 is merely one of embodiments, and the source Sa or the drain Da may be electrodes independently formed from the semiconductor pattern SP. In this case, the source Sa and the drain Da may contact the semiconductor pattern SP or may be connected to the semiconductor pattern SP after penetrating through the insulating layer. In an embodiment, the gate GE may be disposed under the semiconductor pattern SP. The transistor TR may have various structures and should not be particularly limited.

The fourth insulating layer 40 may be disposed on the third insulating layer 30 and may cover the gate GE. In an embodiment, the fourth insulating layer 40 may be an inorganic layer having a single-layer or multiple-layer structure. The fifth insulating layer 50 may be disposed on the fourth insulating layer 40. In an embodiment, the fifth insulating layer 50 may be an organic layer having a single-layer or multiple-layer structure.

A first connection electrode CN1 may be disposed on the fourth insulating layer 40. A second connection electrode CN2 may be disposed on the fifth insulating layer 50. The first connection electrode CN1 may be electrically connected to the semiconductor pattern SP via a contact hole defined through the third insulating layer 30 and the fourth insulating layer 40. The second connection electrode CN2 may be electrically connected to the first connection electrode CN1 via a contact hole defined through the fifth insulating layer 50. The sixth insulating layer 60 may be disposed on the fifth insulating layer 50 and may cover the second connection electrode CN2.

In an embodiment, at least one of the first connection electrode CN1 and the second connection electrode CN2 may be omitted or an additional connection electrode may be further provided to connect the light-emitting element EL and the transistor TR. An electrical connection method between the light-emitting element EL and the transistor TR may be changed in various ways depending on the number of the insulating layers disposed between the light-emitting element EL and the transistor TR and should not be particularly limited.

The circuit layer DP-CL may include the scan driver SDV disposed on the base layer BL. FIG. 7 schematically shows the cross-section of the scan driver SDV disposed in the non-display area NDA, however, the invention should not be limited thereto or thereby. In an embodiment, at least some components of the scan driver SDV may be disposed in the display area DA and may overlap the light-emitting element EL.

The scan driver SDV may include a driving transistor TR-D, first signal lines CL1, and second signal lines CL2. The driving transistor TR-D may be disposed on the second insulating layer 20. The driving transistor TR-D may be formed in the same layer as the transistor TR of the pixel PX, however, it should not be limited thereto or thereby. The driving transistor TR-D may be disposed in a layer different from the transistor TR of the pixel PX.

The driving transistor TR-D may include a semiconductor pattern SP, a gate GE, a source IE, and a drain OE. Each of the gate GE, the source IE, and the drain OE may be formed as an electrode and may be independently formed from the semiconductor pattern SP. The source IE and the drain OE may be disposed on the fourth insulating layer 40 and may be connected to the semiconductor pattern SP via a contact hole defined through the third insulating layer 30 and the fourth insulating layer 40.

However, this is merely one of embodiments, and in an embodiment, the driving transistor TR-D may have the same structure as that of the transistor TR of the pixel PX. In this case, since the driving transistor TR-D may be formed through the same process as the transistor TR of the pixel PX, processes may be simplified, and a process cost may be reduced.

The first signal lines CL1 and the second signal lines CL2 may be disposed in different layers from each other. In an embodiment, the first signal lines CL1 may be disposed in the same layer as the layer on which the gate GE of the driving transistor TR-D is disposed, and the second signal lines CL2 may be disposed in the same layer as the layer on which the source IE or the drain OE of the driving transistor TR-D is disposed. The first signal lines CL1 and the second signal lines CL2 may electrically connect the driving transistor TR-D to other components (not shown) of the scan driver SDV. However, this is merely one of embodiments, and in an embodiment, one of the first signal lines CL1 and the second signal lines CL2 may be omitted.

The display element layer DP-OL may be disposed on the circuit layer DP-CL. The display element layer DP-OL may include the light-emitting element EL and a pixel definition layer PDL. The light-emitting element EL may be electrically connected to the transistor TR to form the pixel PX. The light-emitting element EL may be disposed in the display area DA and may emit the light. In an embodiment, the light-emitting element EL may include an organic light-emitting element, a quantum dot light-emitting element, a micro-LED light-emitting element, or a nano-LED light-emitting element, however, it should not be limited thereto or thereby. In an embodiment, the light-emitting element EL may include various embodiments as long as a light may be generated or an amount of the light may be controlled according to an electrical signal.

The light-emitting element EL may include a first electrode AE, a light-emitting layer EM, and a second electrode CE. The first electrode AE may be disposed on the sixth insulating layer 60. The first electrode AE may be connected to the second connection electrode CN2 via a contact hole defined through the sixth insulating layer 60.

The pixel definition layer PDL may be disposed on the first electrode AE and the sixth insulating layer 60 and may expose at least a portion of the first electrode AE. That is, a light-emitting opening OP may be defined through the pixel definition layer PDL to expose at least the portion of the first electrode AE.

The pixel definition layer PDL may include a polymer resin. In an embodiment, the pixel definition layer PDL may include a polyacrylate-based resin or a polyimide-based resin. The pixel definition layer PDL may further include an inorganic material in addition to the polymer resin. In an embodiment, the pixel definition layer PDL may include an inorganic material. In an embodiment, the pixel definition layer PDL may include silicon nitride ($SiN_x$), silicon oxide ($SiO_x$), or silicon oxynitride ($SiO_xN_y$).

In an embodiment, the pixel definition layer PDL may include a light absorbing material. The pixel definition layer PDL may include a black coloring agent. The black coloring agent may include a black pigment or a black dye. The black coloring agent may include a metal material, such as carbon black, chrome, etc., or an oxide thereof.

The light-emitting layer EM may be disposed on the first electrode AE. The light-emitting layer EM may be disposed in an area corresponding to the light-emitting opening OP of the pixel definition layer PDL, however, it should not be limited thereto or thereby. In an embodiment, the light-emitting layer EM may extend toward an upper surface of the pixel definition layer PDL and may be commonly disposed over the pixels PX.

The light-emitting layer EM may provide a light with a predetermined color. The light-emitting layer EM may include an organic light-emitting material and/or an inorganic light-emitting material. In an embodiment, the light-emitting layer EM may include a fluorescent or phosphorescent material, an organometallic complex light-emitting material, or a quantum dot. FIG. 7 shows the light-emitting layer EM that is patterned and has a single-layer structure, however, it should not be limited thereto or thereby. The light-emitting layer EM may have a multiple-layer structure. In an embodiment, the light-emitting layer EM may include a main light-emitting layer and an auxiliary light-emitting layer disposed on the main light-emitting layer. The main light-emitting layer and the auxiliary light-emitting layer may have a thickness changed depending on a wavelength of the light emitted from the light-emitting layer EM, and a resonant distance of the light-emitting element EL may be controlled by providing the auxiliary light-emitting layer. In addition, as the auxiliary light-emitting layer is provided, a color purity of the light emitted from the light-emitting layer EM may be improved.

The second electrode CE may be disposed on the light-emitting layer EM. The second electrode CE may be commonly disposed over the pixels PX. The second electrode CE may receive a common voltage, and the second electrode CE may be also referred to as a common electrode.

In an embodiment, the light-emitting element EL may further include light-emitting functional layers disposed between the first electrode AE and the second electrode CE. In an embodiment, the light-emitting element EL may include a hole transport layer or a hole injection layer disposed between the first electrode AE and the light-emitting layer EM and an electron transport layer or an electron injection layer disposed between the light-emitting layer EM and the second electrode CE.

The first voltage may be applied to the first electrode AE via the transistor TR, and the common voltage may be applied to the second electrode CE. Holes and electrons, which are injected into the light-emitting layer EM, may be recombined with each other to generate excitons. The light-emitting element EL may emit the light through the display area DA when the excitons return to a ground state from an excited state.

A power pattern ES of the display panel DP may be disposed in the non-display area NDA. The power pattern ES may be electrically connected to the second electrode CE. The power pattern ES may apply a power supply voltage to the second electrode CE. The display panel DP may include a conductive pattern CP connected to the power pattern ES and the second electrode CE. The conductive pattern CP may receive the same voltage as a voltage applied to the power pattern ES.

The encapsulation layer TFE may be disposed on the display element layer DP-OL and may cover the light-emitting element EL. The encapsulation layer TFE may encapsulate the light-emitting element EL. The encapsulation layer TFE may include at least one insulating layer, and the insulating layer may be an inorganic layer or an organic layer. In an embodiment, the encapsulation layer TFE may include a plurality of insulating layers, at least one among the insulating layers may be the organic layer, and at least one among the insulating layers may be the inorganic layer. FIG. 7 shows the encapsulation layer TFE including a first inorganic layer ILL a second inorganic layer IL2, and an organic layer OL as an illustrative embodiment. The first inorganic layer IL1 may be disposed on the second electrode CE. The organic layer OL may be disposed on the first inorganic layer IL1. The second inorganic layer IL2 may be disposed on the organic layer OL and may cover the organic layer OL. However, a stack structure of the encapsulation layer TFE should not be limited thereto or thereby.

The first inorganic layer IL1 and the second inorganic layer IL2 may protect the light-emitting element EL from moisture and/or oxygen. In an embodiment, the first inorganic layer IL1 and the second inorganic layer IL2 may include at least one of aluminum oxide, titanium oxide, silicon oxide, silicon nitride, silicon oxynitride, zirconium oxide, and hafnium oxide, however, they should not be limited thereto or thereby.

The organic layer OL may protect the light-emitting element EL from a foreign substance such as dust particles. In an embodiment, the organic layer OL may include an acrylic-based resin, however, the material of the organic layer OL should not be limited thereto or thereby.

The first inorganic layer IL1 may extend from the display area DA and may be disposed in the non-display area NDA. The first inorganic layer IL1 may cover the power pattern ES and the conductive pattern CP.

The input sensor ISP may be disposed on the display panel DP. The input sensor ISP may include the first, second, and third insulating layers IS-IL1, IS-IL2, and IS-IL3 and the first and second conductive layers IS-CL1 and IS-CL2 as shown in FIG. 4. In FIG. 7, the third insulating layer IS-IL3 (refer to FIG. 4) of the input sensor ISP is not shown, however, the third insulating layer IS-IL3 (refer to FIG. 4) may be disposed on the second insulating layer IS-IL2.

The first insulating layer IS-IL1 may be disposed on the encapsulation layer TFE. The first insulating layer IS-IL1 may be formed through successive processes after the encapsulation layer TFE is formed, and the first insulating layer IS-IL1 may contact an uppermost layer of the encapsulation layer TFE. Referring to FIG. 7, the first insulating layer IS-IL1 may contact the second inorganic layer IL2 provided as the uppermost layer of the encapsulation layer TFE. The first insulating layer IS-IL1 may extend from the display area DA and may be disposed in the non-display area NDA.

The first conductive layer IS-CL1 (refer to FIG. 4) and the second conductive layer IS-CL2 (refer to FIG. 4) of the input sensor ISP may include the sensing electrodes or the sensing signal lines shown in FIG. 6. FIG. 7 schematically shows a cross-section of the components of the input sensor ISP, and the following descriptions are based on the cross-section shown in FIG. 7, however, the arrangement of the components of the input sensor ISP should not be limited thereto or thereby.

The second connection portion CP2 of the input sensor ISP may be formed from the first conductive layer IS-CL1 (refer to FIG. 4) and may be disposed on the first insulating layer IS-IL1. The second connection portion CP2 may overlap the display area DA. The second insulating layer IS-IL2 may be disposed on the first insulating layer IS-IL1 and may cover the second connection portion CP2. The second insulating layer IS-IL2 may extend from the display area DA and may be disposed in the non-display area NDA.

The first sensor portion SP1 and the first connection portion CP1 of the input sensor ISP may be formed from the second conductive layer IS-CL2 (refer to FIG. 4) and may be disposed on the second insulating layer IS-IL2. Although not shown separately, the second sensor portion SP2 (refer to FIG. 6) may also be disposed on the second insulating layer IS-IL2. The first connection portion CP1 may overlap the second connection portion CP2 in a plan view and may be insulated from the second connection portion CP2 by the second insulating layer IS-IL2.

The sensor portions and the connection portions of the input sensor ISP may have a mesh pattern and may be disposed in an area corresponding to an area in which the pixel definition layer PDL is disposed. Accordingly, the input sensor ISP does not exert influence on a light emission efficiency of the light-emitting element EL, however, it should not be limited thereto or thereby. In an embodiment, the input sensor ISP may have a single shape pattern overlapping the light-emitting elements EL and may include a transparent conductive material.

A portion of the second conductive layer IS-CL2 (refer to FIG. 4) may form the sensing signal lines. FIG. 7 shows a portion of the sensing signal lines of the above-described first side sensing signal line group SG1-1 as an illustrative embodiment. The sensing signal lines may be disposed on the second insulating layer IS-IL2, however, they should not be limited thereto or thereby. In an embodiment, the sensing signal lines may be a portion of the first conductive layer IS-CL1 (refer to FIG. 4) and may be disposed on the first insulating layer IS-IL1.

The sensing signal lines may be disposed in the non-display area NDA. The sensing signal lines may overlap the organic layer OL of the encapsulation layer TFE. The sensing signal lines may be disposed on an upper surface OL-U of the organic layer OL adjacent to an inclined surface OL-S of the organic layer OL.

The conductive pattern CP may be disposed between the sensing signal lines and the scan driver SDV, and the sensing signal lines and a portion of the scan driver SDV may overlap the conductive pattern CP in a plan view. The conductive pattern CP may serve as a shielding electrode. That is, the conductive pattern CP may prevent a parasitic capacitance from occurring between the sensing signal lines and the scan driver SDV. Accordingly, a phenomenon in which a signal applied to the sensing signal lines is changed by the scan driver SDV and a noise occurs may be reduced.

The organic layer OL may be formed by providing a liquid polymer resin on the first inorganic layer IL1 and curing the liquid polymer resin. The liquid polymer resin may be formed by a vapor deposition method, a printing method, or a slit coating method, however, it should not be limited thereto or thereby. In an embodiment, the organic layer OL may be formed by an inkjet process.

As the organic layer OL is formed by the liquid resin with a fluidity, the display panel DP may be desired to include a configuration to control a flow of the liquid resin. The display panel DP may include a hydrophobic layer HF, and thus, the flow of the liquid resin forming the organic layer OL may be controlled, and a formation position (or a deposition position) of the organic layer OL may be controlled.

The hydrophobic layer HF may be disposed in the non-display area NDA of the base layer BL. The hydrophobic layer HF may be disposed on a portion of the first inorganic layer IL1 overlapping the non-display area NDA. The hydrophobic layer HF may contact the first inorganic layer IL1.

The hydrophobic layer HF may correspond to a shape of components disposed under the hydrophobic layer HF. That is, an upper surface of the hydrophobic layer HF may have a step difference caused by a structure of the components of the display panel DP, which are disposed under the hydrophobic layer HF.

The hydrophobic layer HF may include a hydrophobic material. In an embodiment, the hydrophobic layer HF may include a fluoride compound. The hydrophobic layer HF may be deposited using a plasma gas or may be formed by a coating process, however, the method of forming the hydrophobic layer HF should not be particularly limited. The hydrophobic layer HF may include a polymer hydrophobic material. The material included in the hydrophobic layer HF should not be particularly limited as long as the material has a hydrophobic property.

An affinity between the hydrophobic layer HF and the organic layer OL may be smaller than an affinity between the first inorganic layer IL1 and the organic layer OL. That is, in a case where the liquid resin forming the organic layer OL is coated on each of the hydrophobic layer HF and the first inorganic layer ILL a contact angle of the liquid resin coated on the hydrophobic layer HF may be greater than a contact angle of the liquid resin coated on the first inorganic layer IL1. In addition, an interfacial energy between the hydrophobic layer HF and the organic layer OL may be greater than an interfacial energy between the first inorganic layer IL1 and the organic layer OL. On this account, the organic layer OL may have a tendency to flow and spread out on the first inorganic layer ILL however, the organic layer OL may tend to agglomerate with each other due to an internal attraction therein without flowing on the hydrophobic layer HF.

The organic layer OL may include a lower surface OL-B that contacts the first inorganic layer ILL the upper surface OL-U opposite to the lower surface OL-B, and the inclined surface OL-S inclined with respect to the upper surface OL-U. The upper surface OL-U of the organic layer OL may provide a flat surface to components disposed on the encapsulation layer TFE. The inclined surface OL-S of the organic layer OL may substantially correspond to an edge of the organic layer OL.

One end of the hydrophobic layer HF may contact the organic layer OL. In detail, the one end of the hydrophobic layer HF may contact the inclined surface OL-S of the organic layer OL. Since the organic layer OL has a relatively low affinity with respect to that of the hydrophobic layer HF, the organic layer OL may not flow on the hydrophobic layer HF, and thus, the one end of the hydrophobic layer HF may contact the inclined surface OL-S of the organic layer OL. Accordingly, the hydrophobic layer HF may prevent the organic layer OL from overflowing to the outside of the display panel DP, and the inclined surface OL-S of the organic layer OL may correspond to an end of deposition point of the organic layer OL.

As the display panel DP includes the hydrophobic layer HF, the flow of the organic layer OL may be controlled without a separate structure that protrudes like a dam to control the flow of organic layer OL, and the organic layer OL may be prevented from overflowing. Accordingly, the configuration of the display panel DP may be simplified in the non-display area NDA, the size of the non-display area NDA may be reduced, and a dead space of the display panel DP may be reduced.

An inclination angle of the inclined surface OL-S may be adjusted according to a material of the hydrophobic layer HF and an amount of the liquid resin that forms the organic layer OL. An angle between the upper surface of the hydrophobic layer HF and the inclined surface OL-S of the organic layer OL may be substantially close to about 90 degrees. In an embodiment, the angle may be substantially equal to or smaller than about 90 degrees, and details thereof will be described later with reference to FIGS. 8A and 8B.

As the angle between the upper surface of the hydrophobic layer HF and the inclined surface OL-S of the organic layer OL becomes close to about 90 degrees, a width of an area corresponding to the inclined surface OL-S in the first direction DR1 may be relatively narrow, and a size of the upper surface OL-U providing a planarized surface may increase. Accordingly, the size of the inclined surface OL-S of the organic layer OL may decrease, and the size of the flat upper surface OL-U may increase due to the hydrophobic layer HF. Accordingly, a thickness of the organic layer OL formed in the display area DA and a thickness of the organic layer OL formed in the non-display area NDA adjacent to the display area DA may be uniform. In an embodiment, the organic layer OL may be formed at a uniform thickness even in an area adjacent to the one end of the hydrophobic layer HF, which corresponds to the end of deposition point of the organic layer OL.

As the size of the flat upper surface OL-U of the organic layer OL increases, the inclined surface OL-S of the organic layer OL may be prevented from being formed in the display area DA. In addition, as the size of the upper surface OL-U of the organic layer OL providing the planarized surface increases, the light-emitting element EL may be disposed on the scan driver SDV, and the display area DA of the display panel DP may increase. On this account, the dead space of the display panel DP may be reduced. In addition, the sensing electrodes and the sensing signal lines may be disposed on the upper surface OL-U of the organic layer OL providing the planarized surface, and a breakage of the sensing signal lines and a deterioration of sensitivity of the input sensor ISP in the area adjacent to the edge of the display panel DP may be prevented.

An end of the hydrophobic layer HF, which is spaced apart from the organic layer OL, may be disposed inside an outer edge of the base layer BL is. The end of the hydrophobic layer HF may be aligned with an edge of the first inorganic layer IL'. However, the hydrophobic layer HF may cover the first inorganic layer IL1 while extending to the outer edge of the base layer BL or may be disposed inside the edge of the first inorganic layer IL1 is, and it should not be limited thereto or thereby.

The second inorganic layer IL2 of the encapsulation layer TFE may extend to the non-display area NDA from the display area DA, and the second inorganic layer IL2 may cover the hydrophobic layer HF and a pattern PA in the non-display area NDA. The second inorganic layer IL2 may contact the hydrophobic layer HF and the pattern PA. The first inorganic layer ILL the hydrophobic layer HF, and the second inorganic layer IL2 may contact each other, may encapsulate the organic layer OL of the encapsulation layer TFE, and may prevent moisture or oxygen from entering the organic layer OL.

FIG. 7 shows a structure in which ends of the first inorganic layer ILL the hydrophobic layer HF, and the second inorganic layer IL2 are aligned with each other as an illustrative embodiment, however, the structure should not be limited thereto or thereby. In an embodiment, the first inorganic layer IL1 and the second inorganic layer IL2 may extend further than the hydrophobic layer HF and may contact each other.

The pattern PA of the display panel DP may be provided in plural. FIG. 7 shows a cross-section of one pattern PA among the patterns PA as an illustrative embodiment. Hereinafter, descriptions of the one pattern PA may be applied to the other patterns PA.

The pattern PA may overlap the non-display area NDA and may be disposed on the hydrophobic layer HF. The pattern PA may contact the hydrophobic layer HF.

The pattern PA may include a lower surface that contacts the hydrophobic layer HF and a curved surface protruded from the lower surface to the third direction DR3 when viewed in a cross-section. That is, the pattern PA may have a droplet shape when viewed in the cross-section.

The affinity between the pattern PA and the hydrophobic layer HF may be relatively low. In an embodiment, the pattern PA may include an organic material with a low affinity with respect to that of the hydrophobic layer HF. The pattern PA may be formed in the droplet shape by an internal attraction thereof without spreading out on the hydrophobic layer HF. A contact angle of the pattern PA disposed on the hydrophobic layer HF may be relatively great. In an embodiment, the contact angle of the pattern PA may be equal to or greater than about 90 degrees. However, the contact angle of the pattern PA should not be limited thereto or thereby.

The pattern PA may include the same material as that of the organic layer OL. The pattern PA may be substantially simultaneously formed with the organic layer OL in the process of forming the organic layer OL. In detail, the pattern PA may be formed by controlling an amount of the liquid polymer resin such that a portion of the liquid polymer resin coated on the first inorganic layer IL1 may be coated on the hydrophobic layer HF in the process of forming the organic layer OL. Accordingly, the pattern PA may be formed without a separate additional process.

The pattern PA may be spaced apart from the organic layer OL. In detail, the pattern PA may be spaced apart from the inclined surface OL-S corresponding to the end of deposition point of the organic layer OL. The pattern PA may be provided in plural, the patterns PA may be spaced apart from the organic layer OL and may be formed along the edge of the organic layer OL. That is, the patterns PA may be formed along the end of deposition point of the organic layer OL. The formation positions of the patterns PA separated from each other may be easily checked by means of an optical measuring device, and the deposition position of the organic layer OL may be predicted based on the formation positions of the patterns PA. This will be described in detail later with reference to FIG. 9.

As the hydrophobic layer HF and the organic layer OL are disposed adjacent to each other, the pattern PA may be easily and simultaneously formed with the organic layer OL. In a case where the hydrophobic layer HF is not disposed in the display panel DP, the organic layer OL may flow toward the outside of the display panel DP, and it is difficult to form the pattern PA, which is disposed separated from the organic layer OL, together with the organic layer OL.

FIGS. 8A and 8B are enlarged cross-sectional views of an embodiment of the display panel DP corresponding to the inclined surface OL-S of the organic layer OL according to the invention. In FIGS. 8A and 8B, some components of the display panel DP are omitted for the convenience of explanation.

Referring to FIGS. 7, 8A, and 8B, the one end HF-O of the hydrophobic layer HF may contact the inclined surface OL-S of the organic layer OL as described above. An angle between the upper surface HF-U of the hydrophobic layer HF adjacent to the one end HF-O of the hydrophobic layer HF and the inclined surface OL-S of the organic layer OL may have a predetermined included angle θ. The included angle θ may be changed depending on the material for the hydrophobic layer HF, the material for the organic layer OL, the amount of the liquid resin coated to form the organic layer OL, or the like.

The included angle θ may be an acute angle or an obtuse angle close to about 90 degrees. As shown in FIG. 7, the included angle θ may be the obtuse angle close to about 90 degrees, however, it should not be limited thereto or thereby. In an embodiment, the included angle θ may be equal to or smaller than about 90 degrees. That is, an angle between the lower surface OL-B of the organic layer OL and the inclined surface OL-S may be greater than about 90 degrees. FIG. 8A shows an embodiment in which the included angle θ is about 90 degrees, and FIG. 8B shows an embodiment in which the included angle θ is the acute angle close to about 90 degrees. As the organic layer OL is controlled by the hydrophobic layer HF having the relatively small affinity with respect to that of the organic layer OL, the included angle θ may be close to about 90 degrees.

As the included angle θ is close to about 90 degrees, the size of the upper surface OL-U of the organic layer OL providing the substantially flat surface may increase. Accordingly, the area in which the light-emitting element EL covered by the encapsulation layer TFE is disposed may increase, and the dead space of the display panel DP may be reduced as the size of the display area DA increases. In addition, the components of the input sensor ISP (refer to FIG. 7) disposed on the encapsulation layer TFE may be disposed on the flat upper surface of the encapsulation layer TFE, and thus, defects, such as, the sensing signal lines are broken and the signal is not transmitted properly to the sensing signal lines, may be prevented.

When the hydrophobic layer HF is not disposed in the display panel DP, the inclined surface OL-S of the organic layer OL may be formed inclinedly to be adjacent to the lower surface OL-B of the organic layer OL, the size of the upper surface OL-U providing the substantially flat surface may be reduced, and a portion of the inclined surface OL-S may overlap the display area DA. Accordingly, a reliability of the light-emitting element EL and the input sensor ISP, which are disposed adjacent to a boundary between the non-display area NDA and the display area DA, may be lowered, and the dead space may increase since an area in which components of the electronic device ED are disposed above the encapsulation layer TFE decreases.

The pattern PA may include a lower surface PA-B that contacts the hydrophobic layer HF and an upper surface PA-U protruded from the lower surface PA-B to the third direction DR3, and the upper surface PA-U may have a curved surface. The upper surface PA-U of the pattern PA may be changed depending on the contact angle between the pattern PA and the hydrophobic layer HF. The contact angle between the pattern PA and the hydrophobic layer HF may be close to about 90 degrees. In detail, the contact angle may be equal to or greater than about 90 degrees. The contact angle between the pattern PA and the hydrophobic layer HF may be changed depending on the material for the pattern PA, the material for the hydrophobic layer HF, or the like.

The upper surface HF-U of the hydrophobic layer HF may have a step difference according to the structure of the components of the display panel DP, which are disposed under the hydrophobic layer HF. In an embodiment, the upper surface HF-U of the hydrophobic layer HF adjacent to the one end HF-O that contacts the organic layer OL may be disposed at a position higher than a position of the upper surface of the hydrophobic layer HF that contacts the pattern PA when viewed in a cross-section. That is, the one end HF-O of the hydrophobic layer HF that contacts the organic layer OL may be disposed at a position higher than a position of the lower surface PA-B of the pattern PA that contacts the hydrophobic layer HF when viewed in the cross-section.

The flow of the organic layer OL may be controlled by the hydrophobic layer HF without providing the separate structure, e.g., the dam, which is disposed outside the organic layer OL and protruded to control the flow of the organic layer OL. That is, even though the area disposed outside the organic layer OL is disposed at a position lower than a position of the area in which the organic layer OL is disposed in the third direction DR3 when viewed in the cross-section, the organic layer OL may be prevented from overflowing by the hydrophobic layer HF.

Figure 9:
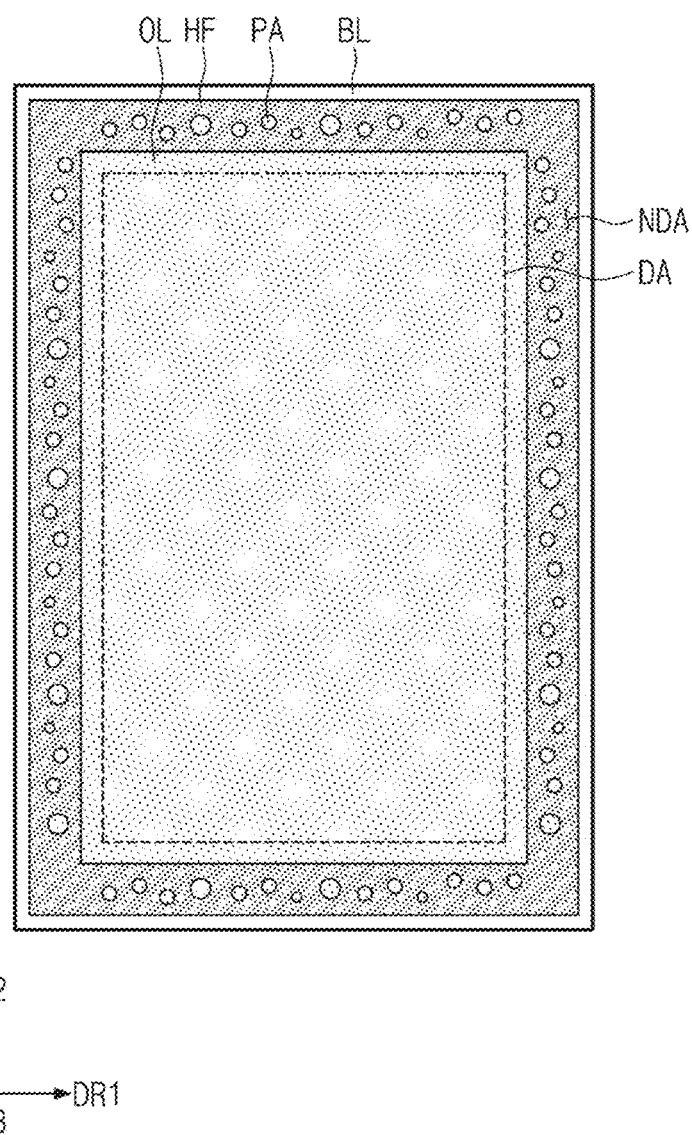
FIG. 9 is a plan view of an embodiment of a display panel according to the invention.

FIG. 9 is a plan view of an embodiment of the display panel DP according to the invention. In FIG. 9, for the convenience of explanation, the base layer BL, the organic layer OL, the hydrophobic layer HF, and the pattern PA of the display panel DP are schematically shown in the plane.

Referring to FIG. 9, the hydrophobic layer HF may be disposed in the non-display area NDA to surround the display area DA. The organic layer OL may cover the display area DA in a plan view. The organic layer OL may extend from the display area DA and may overlap a portion of the non-display area NDA. The organic layer OL may contact the hydrophobic layer HF. The organic layer OL whose flow is controlled by the hydrophobic layer HF may be surrounded by the hydrophobic layer HF. On this account, the end of deposition point of the organic layer OL may be controlled by the hydrophobic layer HF.

The patterns PA may be disposed on the hydrophobic layer HF. The patterns PA may be arranged along the edge of the organic layer OL adjacent to the hydrophobic layer HF. In an embodiment, referring to FIG. 9, the edge of the organic layer OL may include sides extending along the first direction DR1 and the second direction DR2, and the patterns PA may be arranged in the first direction DR1 and the second direction DR2, which correspond to the extension directions of the edge of the organic layer OL.

The patterns PA may have a circular shape or an oval shape in a plan view. The patterns PA may have different sizes from each other.

The patterns PA may be arranged with a predetermined dispersion on some portions of the hydrophobic layer HF. The arrangement of the patterns PA should not be limited as long as the patterns PA are arranged with the predetermined dispersion along the extension directions of the edge of the organic layer OL.

The formation positions of the patterns PA arranged spaced apart from each other may be easily checked by means of the optical measuring device. The deposition position of the organic layer OL may be predicted based on the formation positions of the patterns PA. Thus, it may be checked whether the organic layer OL is formed at a desired position, and the reliability of the display panel DP may be improved.

As the display panel DP includes the hydrophobic layer HF, the flow of the organic layer OL may be controlled, and the deposition position of the organic layer OL may be controlled. Since the inclined angle of the inclined surface of the organic layer OL that contacts the hydrophobic layer HF is close to about 90 degrees, the size of the flat upper surface provided by the organic layer OL may increase. As the hydrophobic layer HF is provided, the separate structures are not desired to control the flow of the organic layer OL on the non-display area NDA, and the dead space of the display panel DP may be reduced. In addition, since the display panel DP includes the hydrophobic layer HF, the patterns PA spaced apart from the organic layer OL may be formed or provided together with the organic layer OL, and the deposition position of the organic layer OL may be monitored using the patterns PA.

Figure 10A:
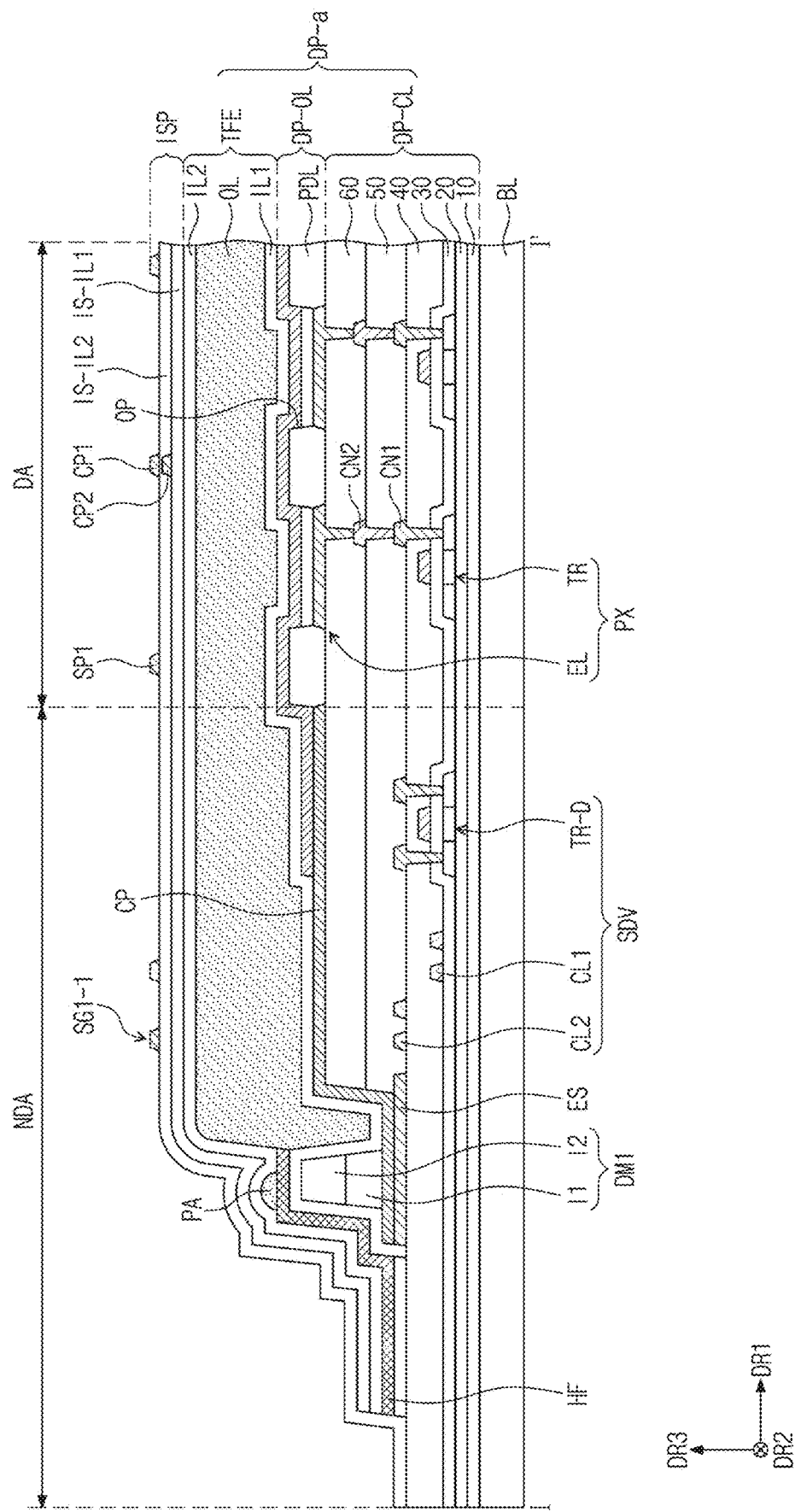
FIGS. 10A to 10C are cross-sectional views of an embodiment of a display panel and an input sensor according to the invention.
Figure 10B:
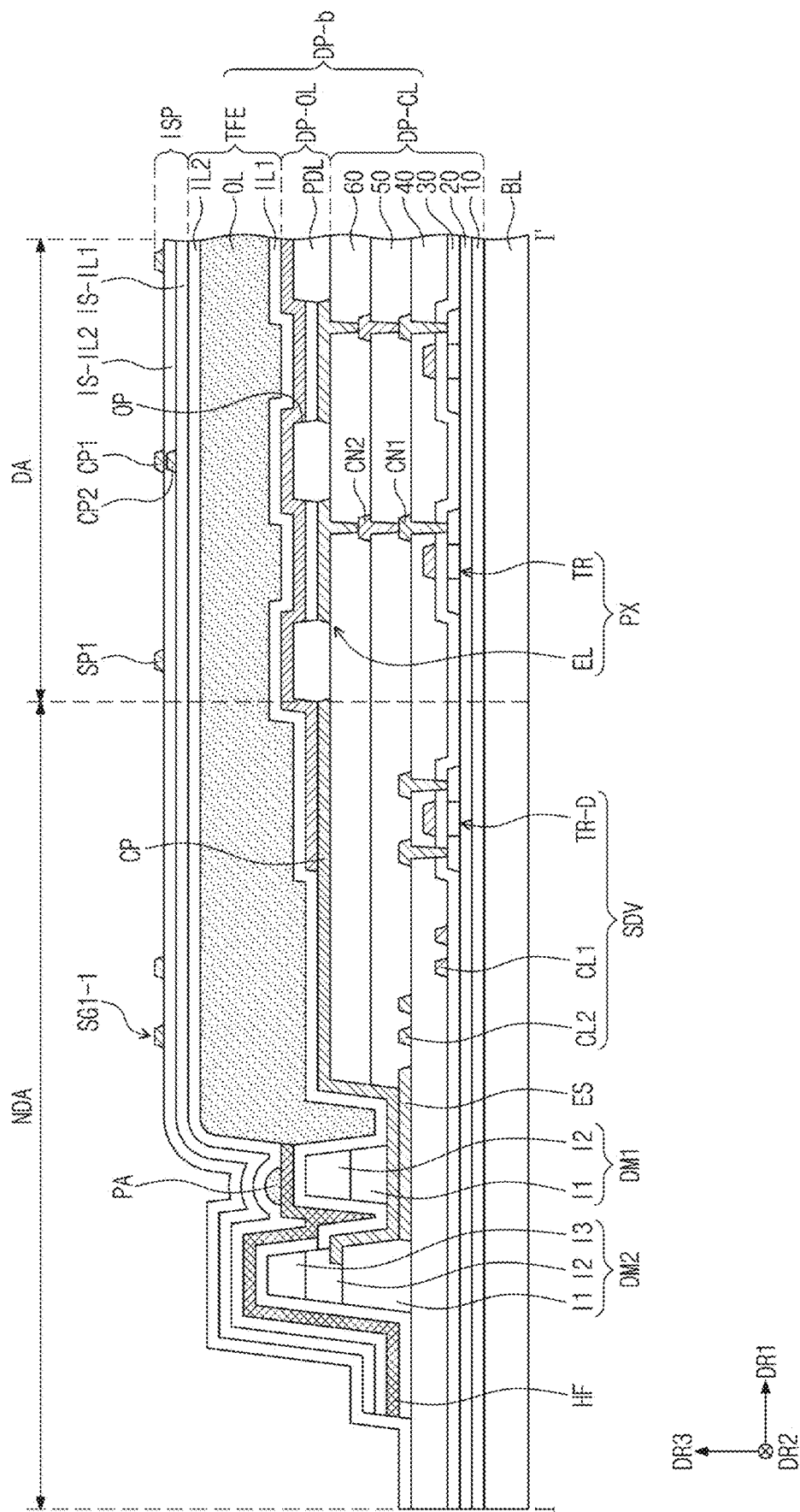
Figure 10C:
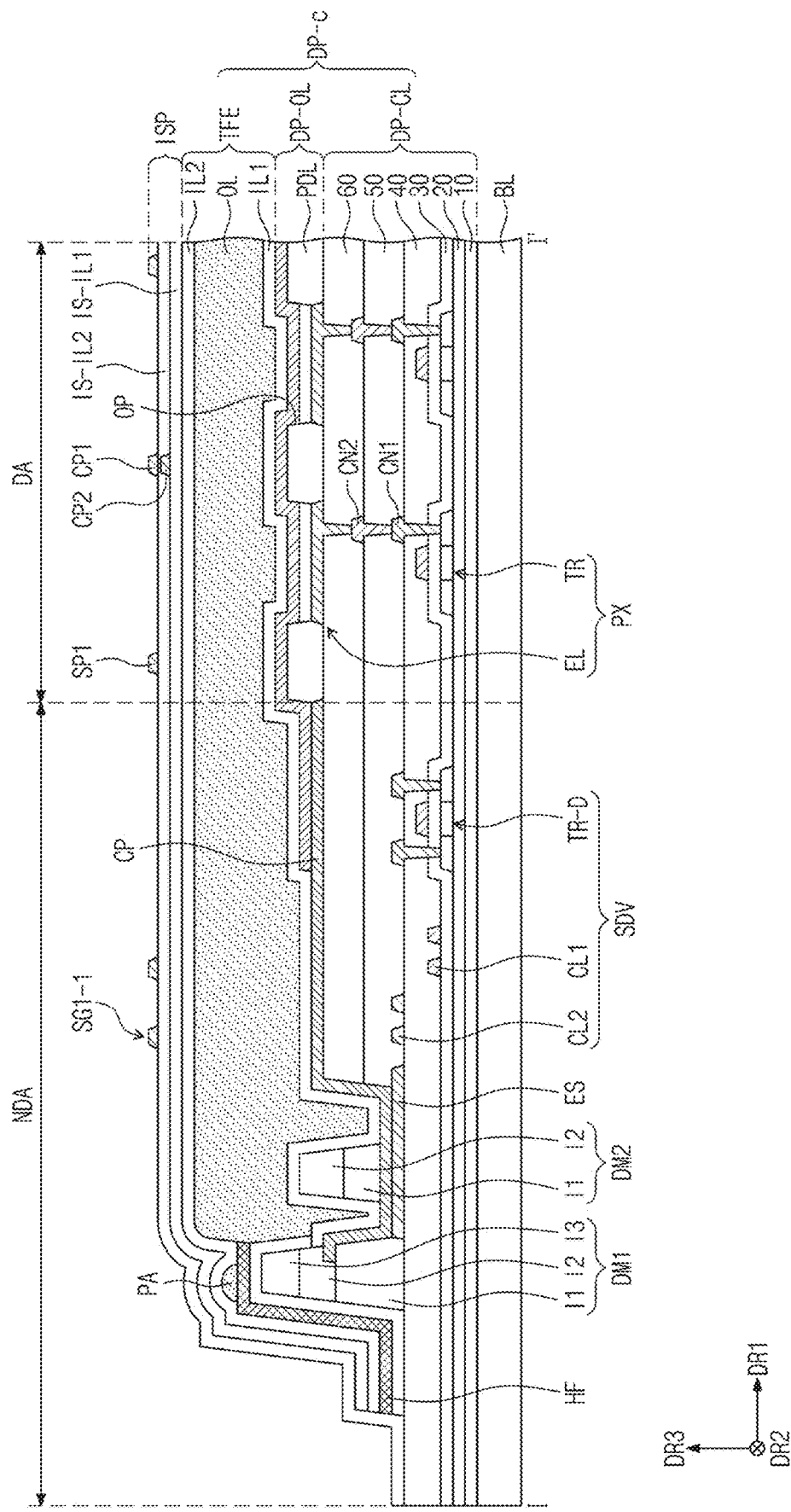

FIGS. 10A to 10C are cross-sectional views of an embodiment of display panels DP-a, DP-b, and DP-c and an input sensor ISP according to the invention. The display panels DP-a, DP-b, and DP-c shown in FIGS. 10A to 10C include substantially the same configurations as those of the display panel DP of FIG. 7 except some components. Hereinafter, details which are the same as those described with reference to FIG. 7 are not repeated, and descriptions will be focused on differences.

Referring to FIG. 10A, the display panel DP-a may further include a first dam DM1. The first dam DM1 may be disposed in the non-display area NDA. The first dam DM1 may be disposed outside the organic layer OL. The first dam DM1 may control the flow of the organic layer OL moving toward an outer edge of the base layer BL. FIG. 10A shows the first dam DM1 disposed on the power pattern ES as an illustrative embodiment, however, it should not be limited thereto or thereby. In an embodiment, the first dam DM1 may be disposed closer to the outside of the non-display area NDA than the power pattern ES is and may not overlap the power pattern ES. That is, a location of the first dam DM1 should not be particularly limited as long as the flow of the organic layer OL may be controlled.

The first dam DM1 may have a multi-layer structure. In an embodiment, the first dam DM1 may include a first layer I1 and a second layer I2. At least one of the first and second layers I1 and I2 included in the first dam DM1 may be formed in the process of forming the insulating layers 10 to 60 of the circuit layer DP-CL or forming the pixel definition layer PDL. However, the first dam DM1 may have a single-layer structure or may have a multi-layer structure including a larger number of layers than that shown in FIG. 10A, and the number of the layers included in the first dam DM1 should not be limited thereto or thereby.

The first dam DM1 may be covered by the first inorganic layer IL1. The hydrophobic layer HF may be disposed on the first dam DM1 covered by the first inorganic layer IL1. That is, the first dam DM1 may overlap the hydrophobic layer HF. The hydrophobic layer HF may be disposed in an area corresponding to an upper surface of the first dam DM1.

Since the affinity between the hydrophobic layer HF and the organic layer OL is relatively low, the organic layer OL may not be spread out on the upper surface of the hydrophobic layer HF. Accordingly, the hydrophobic layer HF may prevent the flow of the organic layer OL and may prevent the organic layer OL from overflowing the first dam DM1 toward the outer edge of the base layer BL.

The pattern PA may be formed on the first dam DM1 and the hydrophobic layer HF. The pattern PA may be covered by the second inorganic layer IL2.

Referring to FIG. 10A, the end of deposition point of the organic layer OL may be adjacent to the first dam DM1. The pattern PA may be formed on the upper surface of the first dam DM1 adjacent to the end of deposition point of the organic layer OL and may be spaced apart from the organic layer OL in a direction away from the display area DA. As the pattern PA is spaced apart from the organic layer OL, the pattern PA does not exert influence on the reliability of the organic layer OL, and as the pattern PA is formed adjacent to the end of deposition point of the organic layer OL together with the organic layer OL, the deposition position of the organic layer OL may be monitored.

Since the display panel DP-a includes the hydrophobic layer HF, the flow of the organic layer OL may be effectively controlled with a single dam. Accordingly, there is no need to provide multiple dams in the non-display area NDA to control the flow of the organic layer OL, and thus, a dead space of the display panel DP-a may be reduced.

Referring to FIG. 10B, the display panel DP-b may further include a first dam DM1 and a second dam DM2. The first dam DM1 and the second dam DM2 may be disposed spaced apart from each other in a direction away from the display area DA. The descriptions on the first dam DM1 of FIG. 10A may be applied to the first dam DM1 of FIG. 10B.

The second dam DM2 may be disposed farther from the inclined surface of the organic layer OL than the first dam DM1 is. The second dam DM2 may overlap the first inorganic layer IL1, the hydrophobic layer HF, and the second inorganic layer IL2, which are sequentially stacked. The organic layer OL whose flow is controlled by the hydrophobic layer HF and the first dam DM1 may not overlap the second dam DM2.

In a case where the hydrophobic layer HF is not disposed on the first dam DM1 and the second dam DM2, the organic layer OL may flow between the first dam DM1 and the second dam DM2 beyond the first dam DM1 or may flow toward the outer edge of the base layer BL beyond the second dam DM2. However, since the first dam DM1 and the second dam DM2 are covered by the hydrophobic layer HF, the overflowing of the organic layer OL may be prevented.

The pattern PA may be disposed between the organic layer OL and the second dam DM2 in a plan view. That is, the pattern PA may be disposed on the first dam DM1 adjacent to the end of deposition point of the organic layer OL. Accordingly, the deposition position of the organic layer OL may be monitored using the pattern PA. However, in another embodiment, a portion of the patterns PA may be formed on the second dam DM2.

The second dam DM2 may have a multi-layer structure. In an embodiment, the second dam DM2 may include first, second, and third layers I1, I2, and I3. At least one of the first, second, and third layers I1, I2, and I3 included in the second dam DM2 may be formed or provided together with the first and second layers I1 and I2 included in the first dam DM1 through the same process. The first dam DM1 and the second dam DM2 may have various structures and should not be particularly limited.

The second dam DM2 may have a height greater than a height of the first dam DM1. Accordingly, the flow of the organic layer OL may be effectively controlled. In addition, the second dam DM2 may prevent the pattern PA from being formed more adjacent to the outside of the display panel DP than the dams DM1 and DM2 are, however, it should not be limited thereto or thereby. In an embodiment, the height of the second dam DM2 may be substantially the same as or smaller than the height of the first dam DM1.

Referring to FIG. 10C, the display panel DP-c may further include a first dam DM1 and a second dam DM2. When compared with the display panel DP-b of FIG. 10B, the first dam DM1 of FIG. 10C may be disposed farther from the display area DA than the second dam DM2 is. That is, the second dam DM2 may be disposed closer to the display area DA that the first dam DM1 is. In an embodiment, the second dam DM2 may be disposed on the power pattern ES, however, it should not be limited thereto or thereby. In an embodiment, both the first and second dams DM1 and DM2 may be disposed closer to the outer edge of the base layer BL than the power pattern ES is and may not overlap the power pattern ES, for example.

Referring to FIG. 10C, the first dam DM1 may have a multi-layer structure of three layers I1, I2, and I3, and the second dam DM2 may have a multi-layer structure of two layers I1 and I2. A height of the second dam DM2 may be smaller than a height of the first dam DM1, however, the invention should not be limited thereto or thereby.

The second dam DM2 may not overlap the hydrophobic layer HF. Accordingly, the organic layer OL may flow on the second dam DM2, and the second dam DM2 may overlap the organic layer OL disposed in the non-display area NDA. The organic layer OL may flow to the first dam DM1 covered by the hydrophobic layer HF in the process of forming the organic layer OL, and the flow of the organic layer OL may be controlled by the hydrophobic layer HF and the first dam DM1. The pattern PA may be formed or provided together with the organic layer OL in the process of forming the organic layer OL, and the pattern PA may be disposed on the first dam DM1 adjacent to the end of deposition point of the organic layer OL. The deposition position of the organic layer OL may be monitored by the pattern PA.

As the display panel includes the hydrophobic layer, the flow of the organic layer of the encapsulation layer and the size of the inclined surface of the organic layer may be controlled. Due to the hydrophobic layer, the organic layer may be prevented from overflowing the display panel, and the inclined surface of the organic layer may be prevented from being formed in the display area adjacent to the edge of the display panel. As the size of the flat upper surface of the organic layer increases, the area in which the light-emitting element of the electronic device is disposed may increases, and the reliability of the sensitivity of the input sensor adjacent to the edge of the electronic device may be improved.

By the embodiments, the patterns may be formed or provided together with the organic layer in the process of forming the organic layer, may be disposed on the hydrophobic layer, and may include the organic material. As the patterns are formed on the hydrophobic layer adjacent to the edge of the organic layer, the deposition position of the organic layer may be monitored using the patterns, and the reliability of the display panel and the electronic device including the display panel may be improved.

Although the embodiments of the invention have been described, it is understood that the invention should not be limited to these embodiments but various changes and modifications may be made by one ordinary skilled in the art within the spirit and scope of the invention as hereinafter claimed.

Therefore, the disclosed subject matter should not be limited to any single embodiment described herein, and the scope of the invention shall be determined according to the attached claims.

What is claimed is:

1. A display panel comprising:
a base layer comprising a display area and a non-display area adjacent to the display area;
a plurality of light-emitting elements disposed in the display area;
a hydrophobic layer disposed in the non-display area and spaced apart from the light-emitting elements;
an insulating layer disposed on the light-emitting elements and comprising an upper surface and an inclined surface inclined with respect to the upper surface; and
a plurality of patterns contacting with the hydrophobic layer, wherein the plurality of patterns is spaced apart from the inclined surface,
wherein an end of the hydrophobic layer contacts the inclined surface of the insulating layer.

2. The display panel of claim 1, wherein the hydrophobic layer comprises a fluoride compound.

3. The display panel of claim 1, wherein the hydrophobic layer surrounds the insulating layer in a plan view.

4. The display panel of claim 1, wherein an angle between the inclined surface of the insulating layer and an upper surface of the hydrophobic layer is equal to or smaller than about 90 degrees.

5. The display panel of claim 1, wherein the one end of the hydrophobic layer is disposed at a position higher than a position at which lower surfaces of the plurality of patterns contacting with the hydrophobic layer are disposed in a cross-section.

6. The display panel of claim 1, wherein the plurality of patterns and the insulating layer comprise an organic material.

7. The display panel of claim 1, wherein the plurality of patterns comprises a same material as a material of the insulating layer.

8. The display panel of claim 1, wherein each of the plurality of patterns comprises:

a lower surface contacting with the hydrophobic layer; and a curved surface protruded from the lower surface in a cross-section.

9. The display panel of claim 1, wherein the plurality of patterns is arranged along a direction in which an edge of the insulating layer extends in a plan view.

10. The display panel of claim 1, further comprising a first dam disposed on the base layer and covered by the hydrophobic layer, wherein the plurality of patterns overlaps the first dam.

11. The display panel of claim 10, further comprising a second dam disposed on the base layer, wherein the second dam is spaced apart from the insulating layer with the first dam interposed therebetween.

12. The display panel of claim 11, wherein the second dam is covered by the hydrophobic layer.

13. The display panel of claim 10, further comprising a second dam disposed on the base layer and overlapping the insulating layer in a plan view, wherein the second dam does not overlap the hydrophobic layer.

14. An electronic device comprising:
a display panel; and
an input sensor disposed on the display panel and comprising an insulating layer and a conductive layer, the display panel comprising:
a base layer;
a plurality of light-emitting elements disposed on the base layer;
a hydrophobic layer disposed on the base layer and spaced apart from the light-emitting elements;
an encapsulation layer disposed on the light-emitting elements and comprising a first inorganic layer, a second inorganic layer, and an organic layer disposed between the first inorganic layer and the second inorganic layer; and
a plurality of patterns disposed on the hydrophobic layer, wherein the organic layer comprises an upper surface and an inclined surface inclined with respect to the upper surface, and the plurality of patterns is spaced apart from the inclined surface,
wherein an end of the hydrophobic layer contacts the inclined surface of the organic layer.

15. The electronic device of claim 14, wherein the conductive layer of the input sensor comprises:
sensing electrodes; and
sensing signal lines connected to the sensing electrodes, and the sensing electrodes and the sensing signal lines overlap the upper surface of the organic layer.

16. The electronic device of claim 14, wherein the insulating layer of the input sensor contacts the second inorganic layer.

17. The electronic device of claim 14, wherein each of the plurality of patterns comprises:
a lower surface contacting with the hydrophobic layer; and
a curved surface protruded from the lower surface in a cross-section.

18. The electronic device of claim 14, wherein the first inorganic layer is disposed under the hydrophobic layer, and the second inorganic layer covers the hydrophobic layer and the plurality of patterns.

19. The electronic device of claim 14, wherein the display panel further comprises a dam disposed on the base layer and covered by the hydrophobic layer.

* * * * *